(12) United States Patent
Song et al.

(10) Patent No.: US 10,083,136 B2
(45) Date of Patent: Sep. 25, 2018

(54) ELECTRONIC COMPONENT, SEMICONDUCTOR PACKAGE, AND ELECTRONIC DEVICE USING THE SAME

(71) Applicants: Nam-ho Song, Uiwang-si (KR); Teck-su Oh, Anyang-si (KR)

(72) Inventors: Nam-ho Song, Uiwang-si (KR); Teck-su Oh, Anyang-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 294 days.

(21) Appl. No.: 15/016,242

(22) Filed: Feb. 4, 2016

(65) Prior Publication Data

US 2016/0233156 A1   Aug. 11, 2016

(30) Foreign Application Priority Data

Feb. 5, 2015 (KR) .......................... 10-2015-0018265

(51) Int. Cl.
*H01L 21/52* (2006.01)
*G06F 13/28* (2006.01)
(Continued)

(52) U.S. Cl.
CPC .......... *G06F 13/28* (2013.01); *H01L 23/3121* (2013.01); *H01L 23/49555* (2013.01); *H01L 23/13* (2013.01); *H01L 24/06* (2013.01); *H01L 24/29* (2013.01); *H01L 24/32* (2013.01); *H01L 24/45* (2013.01); *H01L 24/48* (2013.01); *H01L 2224/04042* (2013.01); *H01L 2224/06135* (2013.01); *H01L 2224/06136* (2013.01); *H01L 2224/2919* (2013.01); *H01L 2224/32245* (2013.01); *H01L 2224/45139* (2013.01); *H01L 2224/45144* (2013.01);
(Continued)

(58) Field of Classification Search
None
See application file for complete search history.

(56) References Cited

U.S. PATENT DOCUMENTS 5,232,379 A    8/1993 Lai
5,898,220 A *  4/1999 Ball .................. H01L 23/4951
                                              257/676
(Continued)

FOREIGN PATENT DOCUMENTS

JP    2007317904    12/2007
JP    2011182017     9/2011
(Continued)

*Primary Examiner* — Cheng-Yuan Tseng
(74) *Attorney, Agent, or Firm* — Renaissance IP Law Group LLP

(57) ABSTRACT

An electronic component, a semiconductor package, and an electronic device including the electronic component and/or the semiconductor package are provided. The electronic component includes an electronic element; an encapsulation member that encapsulates the electronic element and has a first surface and a second surface substantially parallel to each other; and a lead electrically connected to the electronic element and extending outward from the encapsulation member. The lead is disposed entirely in a region between a plane of the first surface of the encapsulation member and a plane of the second surface of the encapsulation member.

20 Claims, 17 Drawing Sheets

(51) Int. Cl.
*H01L 23/31* (2006.01)
*H01L 23/495* (2006.01)
*H01L 23/00* (2006.01)
*H01L 23/13* (2006.01)

(52) U.S. Cl.
CPC ............... *H01L 2224/45147* (2013.01); *H01L 2224/45565* (2013.01); *H01L 2224/45644* (2013.01); *H01L 2224/45664* (2013.01); *H01L 2224/45669* (2013.01); *H01L 2224/4826* (2013.01); *H01L 2224/48091* (2013.01); *H01L 2224/48227* (2013.01); *H01L 2224/48247* (2013.01); *H01L 2224/73215* (2013.01); *H01L 2224/8546* (2013.01); *H01L 2224/85439* (2013.01); *H01L 2224/85444* (2013.01); *H01L 2224/85447* (2013.01); *H01L 2224/85449* (2013.01); *H01L 2224/85455* (2013.01); *H01L 2224/85457* (2013.01); *H01L 2224/85469* (2013.01); *H01L 2224/85471* (2013.01); *H01L 2924/1032* (2013.01); *H01L 2924/10253* (2013.01); *H01L 2924/10271* (2013.01); *H01L 2924/10272* (2013.01); *H01L 2924/10329* (2013.01); *H01L 2924/10333* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/1461* (2013.01); *H01L 2924/14511* (2013.01); *H01L 2924/1576* (2013.01); *H01L 2924/15747* (2013.01); *H01L 2924/181* (2013.01); *H01L 2924/1815* (2013.01); *H01L 2924/18165* (2013.01)

(56) References Cited

U.S. PATENT DOCUMENTS

| | | | |
|---|---|---|---|
| 6,100,804 A * | 8/2000 | Brady | G06K 19/07749 257/678 |
| 6,338,633 B1 | 1/2002 | Dong | |
| 6,495,908 B2 * | 12/2002 | Yang | H01L 21/565 257/666 |
| 6,677,665 B2 * | 1/2004 | Huang | H01L 23/49575 257/666 |
| 6,756,658 B1 | 6/2004 | Gillett et al. | |
| 6,777,266 B2 * | 8/2004 | Huang | H01L 23/49513 257/E23.04 |
| 7,033,457 B2 | 4/2006 | Kim et al. | |
| 7,309,923 B2 * | 12/2007 | Kee | H01L 23/49575 257/666 |
| 7,583,512 B2 | 9/2009 | Ryu et al. | |
| 8,199,462 B2 | 6/2012 | Zednicek et al. | |
| 8,272,126 B2 | 9/2012 | Yoshioka et al. | |
| 8,419,447 B2 | 4/2013 | Freedman | |
| 9,293,400 B2 * | 3/2016 | Ananiev | H01L 23/49575 |
| 2008/0296589 A1 * | 12/2008 | Speier | H01L 33/642 257/82 |
| 2010/0032818 A1 * | 2/2010 | Pilling | H01L 23/49503 257/676 |
| 2013/0114230 A1 | 5/2013 | Zhou et al. | |

FOREIGN PATENT DOCUMENTS

KR 100384880 5/2003
KR 20100052757 5/2010

* cited by examiner

ELECTRONIC COMPONENT, SEMICONDUCTOR PACKAGE, AND ELECTRONIC DEVICE USING THE SAME

CROSS-REFERENCE TO RELATED APPLICATION

This application claims the benefit of Korean Patent Application No. 10-2015-0018265, filed on Feb. 5, 2015, in the Korean Intellectual Property Office, the disclosure of which is incorporated herein in its entirety by reference.

BACKGROUND

The inventive concept relates to an electronic component, a semiconductor package, and an electronic device using the same, and more particularly, to an electronic component, a semiconductor package, and an electronic device using the same, capable of implementing a slimmer electronic device while maintaining excellent performance.

A high-capacity electronic component has a larger thickness than a low-capacity electronic component. Thus, an electronic device using a high-capacity electronic component is difficult to be made slimmer. On the other hand, if more low-capacity electronic components with a smaller thickness are used for making an electronic device slimmer, an area of the electronic device increases, thus resulting in an increase in the size of the electronic device. Therefore, research has been conducted to solve a tradeoff relation between the thickness and the size of the electronic device.

SUMMARY

The inventive concept provides an electronic component capable of obtaining a slimmer electronic device while maintaining excellent performance.

The inventive concept provides a semiconductor package capable of obtaining a slimmer electronic device while maintaining excellent performance.

The inventive concept provides a slimmer electronic device capable of maintaining excellent performance.

According to an aspect of the inventive concept, an electronic component is provided. The electronic component may comprise an electronic element; an encapsulation member that encapsulates the electronic element and has a first surface and a second surface parallel to each other, wherein a height of the encapsulation member is a distance between the first surface and the second surface, and a central line of the encapsulation member is located equidistant from the first surface and the second surface; and a lead electrically connected to the electronic element and extending outward from the encapsulation member, wherein the lead may be disposed entirely in a region between a plane of the first surface of the encapsulation member and a plane of the second surface of the encapsulation member.

In one embodiment, the lead inside the encapsulation member may extend from the electronic element in a direction parallel to the first surface of the encapsulation member.

In another embodiment, a degree of deviation of a center of a front end of the lead from the central line of the encapsulation member may be no greater than 30% of the height of the encapsulation member. The front end of the lead is located farthest from the electronic element in a direction substantially parallel to the first surface of the encapsulation member.

In another embodiment, the electronic element may be a capacitor, a resistor, an inductor, or combination of two or more thereof.

In another embodiment, a distal portion of the lead exposed to the outside of the encapsulation member may be bent in a curved shape toward the first or second surface of the encapsulation member.

In another embodiment, a distance between a central line of a front end of the lead and a farthest point of the curved-shaped bent region may be no greater than 30% of the height of the encapsulation member. The front end of the lead is located farthest from the electronic element in a direction substantially parallel to the first surface of the encapsulation member.

In another embodiment, a distance in a direction parallel to the first surface of the encapsulation member between a point where the lead exits the encapsulation member and a front end of the lead may be in the range of about 0.1 mm to about 3 mm, wherein the front end of the lead is located farthest from the electronic element in a direction substantially parallel to the first surface 1 of the encapsulation member.

According to another aspect of the inventive concept, a semiconductor package is provided. The semiconductor package comprises a semiconductor substrate; an encapsulation member that encapsulates the semiconductor substrate; and a lead electrically connected to the semiconductor substrate and extending outward from the encapsulation member, wherein the encapsulation member has a first surface and a second surface substantially parallel to each other, wherein a height of the encapsulation member is a distance between the first surface and the second surface, and wherein a central line of the encapsulation member is located equidistant from the first surface and the second surface, and the lead may be disposed entirely in a region between a plane of the first surface of the encapsulation member and a plane of the second surface of the encapsulation member.

In one embodiment, the semiconductor package may further include a package substrate on which the semiconductor substrate is mounted.

In another embodiment, a portion of the lead may extend inward from the encapsulation member, and the lead in the encapsulation member may be on a substantially same plane as the package substrate.

In another embodiment, the package substrate may form a portion of the first surface of the encapsulation member.

In another embodiment, a degree of deviation of a center of a front end of the lead from the central line of the encapsulation member may be no greater than 30% of a height between the first surface and the second surface of the encapsulation member. The front end of the lead is located farthest from the electronic element in a direction substantially parallel to the first surface 1 of the encapsulation member.

In another embodiment, a distance measured in a direction parallel to the first surface of the encapsulation member between a point where the lead exits the encapsulation member and a front end of the lead may be in the range of about 0.1 mm to about 3 mm.

In another embodiment, a portion of one surface of the lead may form a portion of the first surface of the encapsulation member, and the lead may include a distal portion that is bent toward the central line of the encapsulation member.

In another embodiment, the bent portion may have a gull-wing shape or a curved shape.

In another embodiment, the semiconductor substrate and the lead may be connected by a bonding wire.

In another embodiment, a portion of the semiconductor substrate may form a portion of the first surface of the encapsulation member. The lead outside of the encapsulation member may extend in parallel to the first surface of the encapsulation member.

In another embodiment, a portion of the lead overlaps with a portion of the semiconductor substrate and is attached to the semiconductor substrate via a binder disposed between the lead and the semiconductor substrate. The lead may be wire-bonded to a bonding pad disposed adjacent a central line of the semiconductor substrate.

According to another aspect of the inventive concept, an electronic device is provided. The electronic device may comprise a substrate having an upper surface and a lower surface facing each other; and an electronic component having a first surface and a second surface facing each other and mounted on the substrate, wherein the first surface and the second surface of the electronic component protrude outward from the upper surface and the lower surface of the substrate, respectively.

In one embodiment, the electronic component is mounted in an opening that is formed in the substrate and passes through the substrate and at least a portion of the electronic component passes through the opening.

In another embodiment, the opening may have a rectangular shape and four edges of the opening may be a portion of the substrate.

In another embodiment, the substrate may have a recess that is recessed in a direction parallel to the upper surface of the substrate, and at least a portion of the electronic component may be accommodated in the recess.

In another embodiment, the recess may have at least two straight-line edges, and terminals that are electrically connectable to the electronic component may be provided at the at least two straight-line edges.

In another embodiment, the electronic component may include at least two leads extending from two opposite sides of the electronic component in a direction substantially parallel to the upper surface of the substrate and electrically connectable to terminals provided on the substrate.

In another embodiment, each of leads may have a distal portion extending in the direction substantially parallel to the upper surface of the substrate and electrically connectable to a corresponding terminal on the substrate.

In another embodiment, each of leads may have a distal portion bent to the opening and electrically connectable to a corresponding terminal on the substrate.

In another embodiment, the leads may be disposed on corresponding terminals on the substrate.

In another embodiment, the substrate may include a notched portion capable of accommodating the terminals, the terminals may be disposed in the notched portion, and the leads of the electronic component may be connected to corresponding terminals in the notched portion.

In another embodiment, a height between the first surface of the electronic component and the upper surface of the substrate may be substantially equal to a height between the second surface of the electronic component and the lower surface of the substrate.

In another embodiment, the electronic component may include a capacitor, and the electronic component may be configured to supply a backup voltage to a semiconductor device mounted on the substrate.

According to another aspect of the inventive concept, an electronic system is provided. The electronic system may comprise a controller; an input/output unit configured to input or output data; a memory device configured to store data; an interface configured to transmit data to an external device; and a bus configured to allow the controller, the input/output device, and the interface to communicate with one another, wherein at least one of the controller, the input/output device, and the interface includes the electronic component and/or the semiconductor package.

According to another aspect of the inventive concept, an electronic device is provided. The electronic device may comprise a substrate having an upper surface and a lower surface facing each other; and an electronic component having a first surface and a second surface facing each other and mounted on an opening formed on the substrate. The second surface of the electronic component may protrude downward from the lower surface of the substrate.

In one embodiment, the first surface of the electronic component protrudes upward from the upper surface of the substrate.

In another embodiment, a height between the first surface of the electronic component and the upper surface of the substrate may be substantially equal to a height between the second surface of the electronic component and the lower surface of the substrate.

In another embodiment, a height between the first surface of the electronic component and the upper surface of the substrate may be different from a height between the second surface of the electronic component and the lower surface of the substrate.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
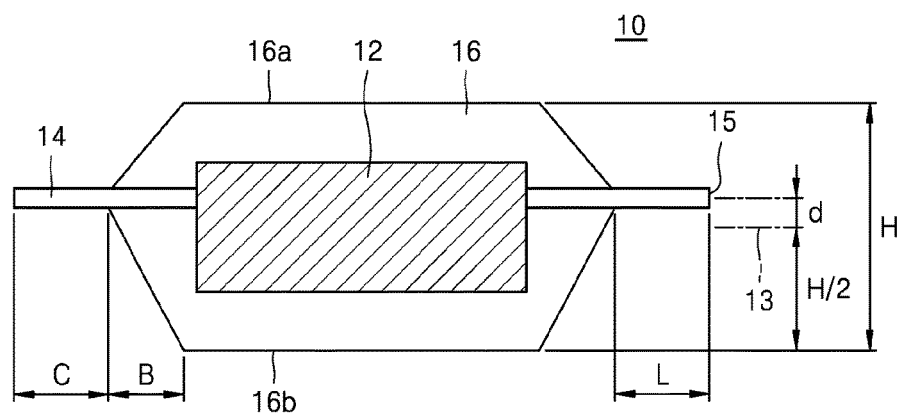
FIGS. 1A, 2A, 3A, and 4A are side cross-sectional views of electronic components according to exemplary embodiments of the inventive concept.

Hereinafter, embodiments of the inventive concept will be described with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated or reduced for clarity of the inventive concept. As used herein, the term "and/or" includes any and all combinations of one or more of the associated listed items. Expressions such as "at least one of," when preceding a list of elements, modify the entire list of elements and do not modify the individual elements of the list.

Also, though terms "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

The terminology used herein is for describing particular embodiments only and is not intended to be limiting of the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms used herein, including technical and scientific terms, have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The inventive concept provides an electronic component including an electronic element, an encapsulation member that encapsulates the electronic element and has a first surface and a second surface that are parallel to each other, and a lead electrically connected to the electronic element and extending outward from the encapsulation member.

FIG. 1A is a side cross-sectional view of an electronic component 10 according to an exemplary embodiment of the inventive concept.

Referring to FIG. 1A, the electronic component 10 may include an electronic element 12. The electronic element 12 may be an active element or a passive element.

The active element may be a transistor, a diode, an OP amp, and the like. However, the exemplary embodiment is not limited thereto, and any type of active elements may be used herein.

The passive element may include at least one selected from among a resistor, a capacitor, an inductor, a thermistor, an oscillator, a ferrite bead, an antenna, a varistor, and a crystal. However, the exemplary embodiment is not limited thereto, and any type of passive elements may be used herein.

The electronic element 12 may be encapsulated by the encapsulation member 16. The encapsulation member 16 may be one or more selected from among epoxy molding compound (EMC), polycarbonate, polyimide, polyester, and polyamide, but is not limited thereto.

The encapsulation member 16 may have a first surface 16a and a second surface 16b that are parallel to each other. The first surface 16a and the second surface 16b of the encapsulation member 16 may constitute an upper surface and a lower surface of the electronic component 10, respectively. Sides of the electronic component 10 may include a plurality of flat surfaces and/or curved surfaces, but is not particularly limited.

A lead 14 may be connected to the electronic element 12 so that the electronic element 12 is electrically connected to an external electronic device. The lead 14 may include copper (Cu), iron (Fe), nickel (Ni), manganese (Mn), cobalt (Co), chromium (Cr), gold (Au), silver (Ag), platinum (Pt), or alloys of two or more materials thereof.

One end of the lead 14 may be electrically connected to the electronic element 12, and the other end of the lead 14 may extend outward from the encapsulation member 16 and be exposed. As illustrated in FIG. 1A, the lead 14 may extend from the electronic element 12 in a direction substantially parallel to the first surface 16a of the encapsulation member 16 immediately before the lead 14 is exposed to the outside of the encapsulation member 16. In other words, the lead 14 may include a first portion B disposed inside the encapsulation member 16 which extends in a direction substantially parallel to the first surface 16a of the encapsulation member 16 and a distal portion C disposed outside the encapsulation member 16.

A length L of a region of the lead 14 that extends to the outside of the encapsulation member 16 may be in the range of about 0.1 mm to about 3 mm. The length L of the region of the lead 14 that extends to the outside of the encapsulation member 16 may be appropriately adjusted according to the size or thickness of the electronic component 10.

The lead 14 may be configured not to deviate from a region between a plane of the first surface 16*a* of the encapsulation member 16 and a plane of the second surface 16*b* of the encapsulation member 16. In particular, the region of the lead 14 that extends to the outside of the encapsulation member 16 may exist only between the plane of the first surface 16*a* of the encapsulation member 16 and the plane of the second surface 16*b* of the encapsulation member 16.

As illustrated in FIG. 1A, a front end of the region of the lead 14 that is exposed to the outside of the encapsulation member 16 is located between the plane of the first surface 16*a* of the encapsulation member 16 and the plane of the second surface 16*b* of the encapsulation member 16. The front end of the lead is defined as a position of the lead 14 that is located farthest from the electronic element 12 with reference to a direction parallel to the first surface 16*a* of the encapsulation member 16.

In particular, the center of the front end 15 may be located near the central line 13 that is located equidistance from the plane of the first surface 16*a* of the encapsulation member 16 and the plane of the second surface 16*b* of the encapsulation member 16. That is, the center of the front end 15 may be located at a position that does not greatly deviate from the central line 13 of the encapsulation member 16.

More specifically, a degree d of deviation of the center of the front end 15 from the central line 13 of the encapsulation member 16 may be equal to or less than 30% (i.e., no greater than 30%) of a height H between the first surface 16*a* and the second surface 16*b* of the encapsulation member 16. By limiting the degree d of deviation of the center of the front end 15 from the central line 13 of the encapsulation member 16, the effect of reducing the entire thickness of the electronic device will increase when the electronic component is inserted into an opening of the substrate.

Figure 1B:
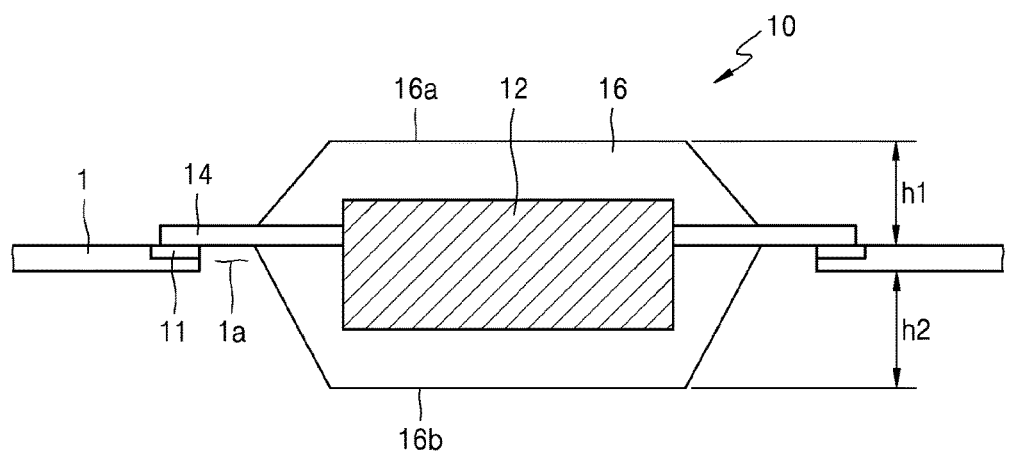
FIGS. 1B, 2B, 3B, and 4B are partial cross-sectional views illustrating states in which the electronic components of FIGS. 1A, 2A, 3A, and 4A are connected to openings of substrates, respectively.

FIG. 1B is a partial cross-sectional view illustrating a state in which the electronic component 10 of FIG. 1A is disposed on a substrate 1.

Referring to FIG. 1B, the electronic component 10 may be inserted into an opening 1*a* of the substrate 1, and leads 14 formed on both sides of the electronic component 10 may be connected to their corresponding terminals 11 of the substrate 1. That is, the distal portions C of the leads 14 may be connected to their corresponding terminals 11 of the substrate 1.

In some embodiments, a height h1 of the electronic component 10 protruding upward from the substrate 1 and a height h2 of the electronic component 10 protruding downward from the substrate 1 may be substantially equal to half a total height H of the electronic component 10. In other embodiments, one of the height h1 of the electronic component 10*a* protruding upward from the substrate 1 and the height h2 of the electronic component 10*a* protruding downward from the substrate 1 may be less than half a total height H of the electronic component 10*a*. That is, a height of the electronic component 10 protruding form one surface of the substrate is significantly smaller than a total height of the electronic component 10. Thus, it is possible to reduce a total height of an electronic device on which the electronic component is disposed, as compared with the case of surface mounting or insertion mounting of the electronic component 10. As a result, an electronic device may be made slimmer.

Figure 2A:
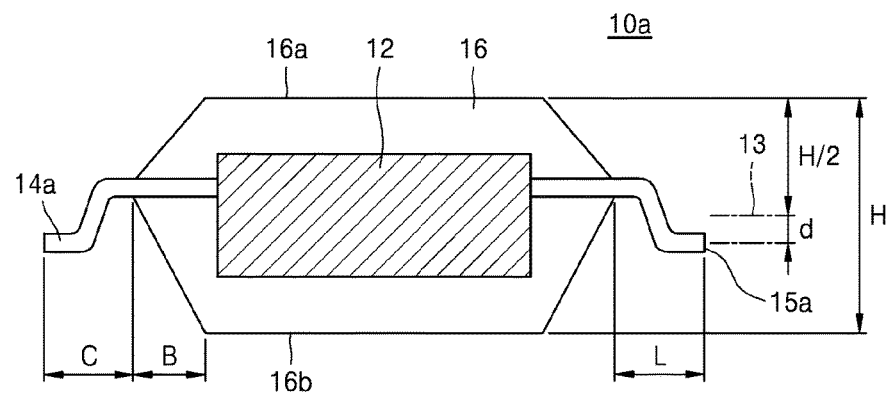

FIG. 2A is a side cross-sectional view of an electronic component 10*a* according to another exemplary embodiment of the inventive concept.

As illustrated in FIG. 2A, the lead 14*a* may extend from an electronic element 12 in a direction parallel to a first surface 16*a* of an encapsulation member 16 immediately before the lead 14*a* is exposed to the outside of the encapsulation member 16. After the lead 14*a* is exposed from the encapsulation member 16, the lead 14*a* may be bent toward a plane of a second surface 16*b* of the encapsulation member 16. Thus, the lead 14*a* may have a gull-wing shape.

More specifically, after the lead 14*a* is exposed from the encapsulation member 16, the lead 14*a* may be bent toward the plane of the second surface 16*b* of the encapsulation member 16 and be then bent again in a direction substantially parallel to the first surface 16*a* of the encapsulation member 16. Optionally, after the lead 14*a* is exposed from the encapsulation member 16, the lead 14*a* may partially extend in a direction parallel to the first surface 16*a* of the encapsulation member 16 and be then bent toward the plane of the second surface 16*b* of the encapsulation member 16.

In this manner, with respect to the center of the frond end 15*a* of the lead 14*a* within the encapsulation member 16, the center of the front end 15*a* of the lead 14*a* may be moved toward the second surface 16*b* of the encapsulation member 16.

Similar to the exemplary embodiment of FIG. 1A, a distance L measured in a direction parallel to the first surface 16*a* of the encapsulation member 16 between a point where the lead 14*a* exits the encapsulation member 16 and the front end may be in the range of about 0.1 mm to about 3 mm. The front end of the lead is defined as a position of the lead 14 that is located farthest from the electronic element 12 with reference to a direction parallel to the first surface 16*a* of the encapsulation member 16.

Figure 2B:
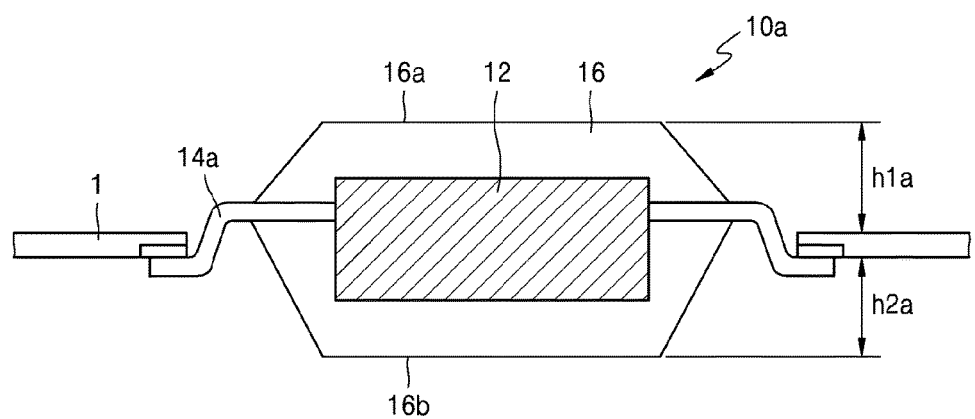

FIG. 2B is a partial cross-sectional view illustrating a state in which the electronic component 10*a* of FIG. 2A is disposed on the substrate 1.

Referring to FIG. 2B, the electronic component 10*a* may be inserted into the opening of the substrate 1, and leads 14*a* formed on both sides of the electronic component 10*a* may be connected to their corresponding terminals of the substrate 1. That is, the distal portions C of the leads 14*a* may be connected to their corresponding terminals 11 of the substrate 1.

In some embodiments, a height h1*a* of the electronic component 10*a* protruding upward from the substrate 1 and a height h2*a* of the electronic component 10*a* protruding downward from the substrate 1 may be substantially equal to half a total height H of the electronic component 10*a*. In other embodiment, the height h1*a* of the electronic component 10*a* protruding upward from the substrate 1 or the height h2*a* of the electronic component 10*a* protruding downward from the substrate 1 may be less than half a total height H of the electronic component 10*a*. Thus, it is possible to greatly reduce a total height of an electronic device on which the electronic component is disposed as compared with the case of surface mounting or insertion mounting of the electronic component 10. As a result, the electronic device may be made slimmer.

In particular, by appropriately using the gull-wing shape according to a position at which the lead 14*a* exits the encapsulation member 16, the height h1*a* of the electronic component 10*a* protruding upward from the substrate 1 may be substantially equal to or similar to the height h2*a* of the electronic component 10*a* protruding downward from the substrate 1. Since the height h1*a* of the electronic component 10a protruding upward from the substrate 1 is made to be substantially equal to the height h2a of the electronic component 10a protruding downward from the substrate 1, a vertical symmetry of an electronic device to be manufactured may be achieved or improved.

Figure 3A:
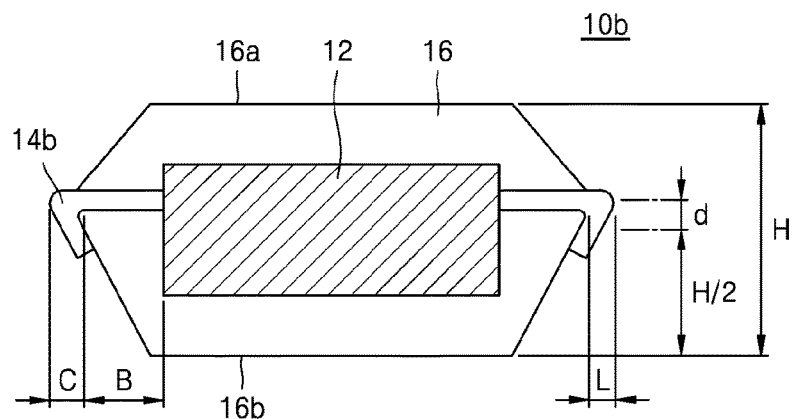

FIG. 3A is a side cross-sectional view of an electronic component 10b according to another exemplary embodiment of the inventive concept.

Referring to FIG. 3A, a lead 14b may extend from an electronic element 12 in a direction parallel to a first surface 16a of an encapsulation member 16 immediately before the lead 14b is exposed to the outside of the encapsulation member 16. After the lead 14b is exposed from the encapsulation member 16, the lead 14b may be bent toward a second surface 16b of the encapsulation member 16 and extend along the surface of the encapsulation member 16. However, the lead 14b does not extend up to the second surface 16b of the encapsulation member 16.

In particular, the encapsulation member 16 may be configured such that the region from which the lead 14b starts to be exposed is convex. As a result, a front end may be formed in a region in which the lead 14b is bent toward the second surface 16b of the encapsulation member 16.

Similar to the exemplary embodiment of FIG. 1A, a distance L measured in a direction parallel to the first surface 16a of the encapsulation member 16 between a point where the lead 14b exits the encapsulation member 16 and the front end may be in the range of about 0.1 mm to about 3 mm. In particular, in the case of the exemplary embodiment of FIG. 3A, since the lead 14b is bent immediately after extending outside the encapsulation member 16, the length L may be significantly short, and thus, the electronic component 10b may have a very compact footprint.

Figure 3B:
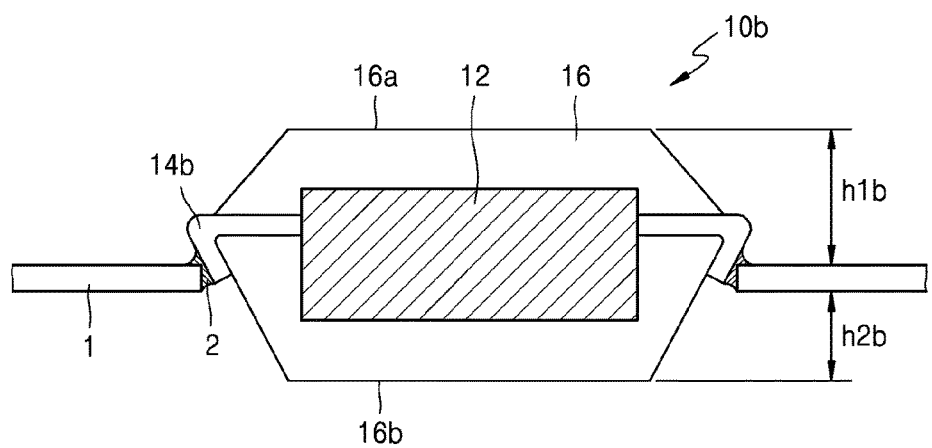

FIG. 3B is a partial cross-sectional view illustrating a state in which the electronic component 10b of FIG. 3A is connected to the opening of the substrate 1.

Referring to FIG. 3B, the electronic component 10b may be inserted into the opening of the substrate 1, and leads 14b formed on both sides of the electronic component 10b may be disposed on the substrate 1. That is, the distal portions C of the leads 14b may be connected to their corresponding terminals 11 of the substrate 1.

At this time, the footprint of the opening of the substrate 1 may be identical to the footprint of the encapsulation member 16, and the lead 14b bent toward the second surface 16b of the encapsulation member 16 may come into point contact or line contact with the corresponding terminal on the substrate 1. In a case where the contact between the lead 14b and the terminal on the substrate 1 is insufficient, an electrical connection between the lead 14b and the terminal may be achieved with a low resistance by using a binder 2 such as a solder paste.

In addition, a height h1b of the electronic component 10b protruding upward from the substrate 1 and a height h2b of the electronic component 10b protruding downward from the substrate 1 may be substantially equal to half a total height H of the electronic component 10b. In other embodiments, the height h1b of the electronic component 10b protruding upward from the substrate 1 or the height h2b of the electronic component 10b protruding downward from the substrate 1 may be less than half a total height H of the electronic component 10b.

Figure 4A:
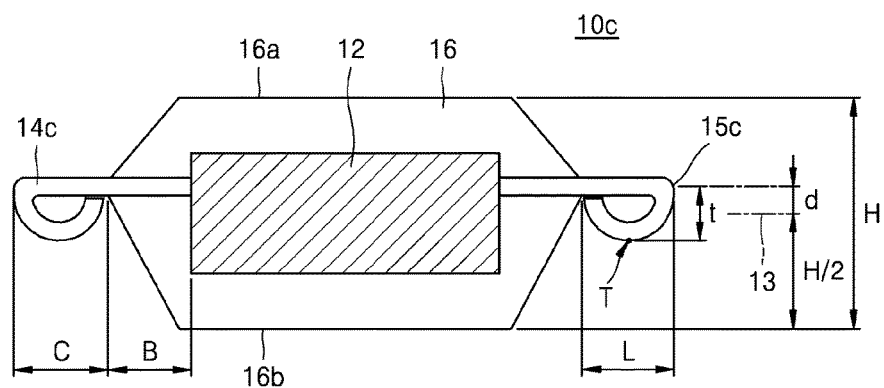

FIG. 4A is a side cross-sectional view of an electronic component 10c according to another exemplary embodiment of the inventive concept.

Referring to FIG. 4A, a lead 14c may extend from an electronic element 12 in a direction parallel to a first surface 16a of an encapsulation member 16 immediately before the lead 14c is exposed to the outside of the encapsulation member 16. After the lead 14c is exposed from the encapsulation member 16, the lead 14a may continue to partially extend in a direction parallel to the first surface 16a of the encapsulation member 16 and be then bent to have a curved shape. In one embodiment, the cured shape is semi-circular loop. In another embodiment, the curved shape may not be a closed loop. The curved-shaped lead 14c that is semi-circularly bent from the front end toward a second surface 16b of the encapsulation member 16 is illustrated in FIG. 4A, but the lead 14c may be semi-circularly bent to have a curved shape toward the first surface 16a of the encapsulation member 16.

In this case, the front end may be defined as an end portion of a straight extension part immediately before being bent to have the curved shape. A distance L in a direction parallel to the first surface 16a of the encapsulation member 16 between a point where the lead 14c exits the encapsulation member 16 and the front end of the lead may be in the range of about 0.1 mm to about 3 mm.

In addition, a distance t between the central line of the front end 5c and the farthest point T of the curved-shaped bent region may be adjusted by changing a radius of curvature of the bent region. The distance t may be set to be equal to or less than 30% (i.e., no greater than 30%) of a height H between the first surface 16a and the second surface 16b of the encapsulation member 16.

In addition, the degree d of deviation of the center of the front end 15c from the central line 13 of the encapsulation member 16 may be equal to or less than 30 (i.e., no greater than 30) % of the height H between the first surface 16a and the second surface 16b of the encapsulation member 16.

Figure 4B:
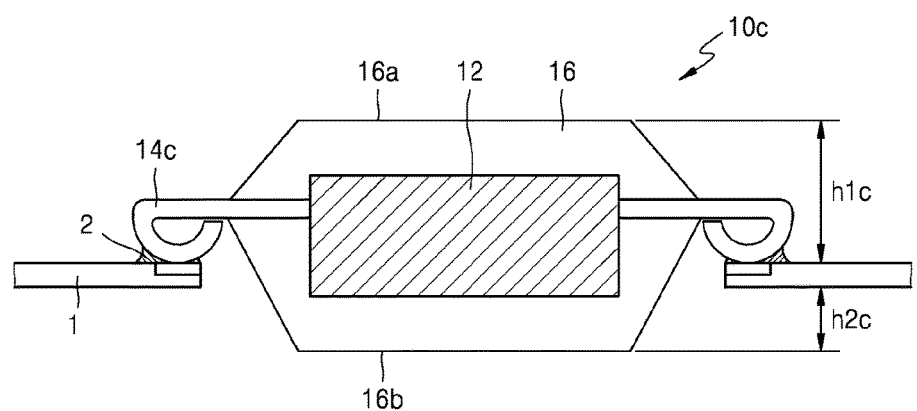

FIG. 4B is a partial cross-sectional view illustrating a state in which the electronic component 10c of FIG. 4A is disposed on the substrate 1.

Referring to FIG. 4B, the electronic component 10c may be inserted into the opening of the substrate 1, and leads 14c formed on both sides of the electronic component 10c may be connected to their corresponding terminals of the substrate 1. That is, the distal portions C of the leads 14c may be connected to their corresponding terminals 11 of the substrate 1.

As a result, a height h1c of the electronic component 10c protruding upward from the substrate 1 and a height h2c of the electronic component 10c protruding downward from the substrate 1 may be equal to or less than half a total height H of the electronic component 10c. In other words, the total height of the electronic device may be greatly reduced, as compared with the case of surface mounting or insertion mounting of the electronic component 10c. As a result, an electronic device may be made slimmer.

In particular, the position from which the lead 14c starts to be exposed to the outside of the encapsulation member 16 may be changed according to the type or specification of the electronic element 12. Thus, by appropriately changing the radius of curvature of J-shaped semi-circular bending, the height h1c of the electronic component 10c protruding upward from the substrate 1 may be substantially equal to or similar to the height h2c of the electronic component 10c protruding downward from the substrate 1. Since the height h1c of the electronic component 10c protruding upward from the substrate 1 is made to be substantially equal to the height h2c of the electronic component 10c protruding downward from the substrate 1, a vertical symmetry of an electronic device to be manufactured may be achieved or improved.

Figure 5A:
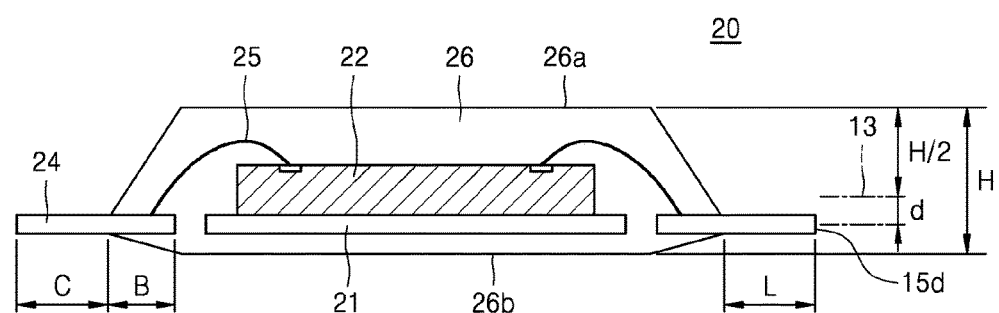
FIGS. 5A, 6A, 7A, and 8A are cross-sectional views of semiconductor packages according to exemplary embodiments of the inventive concept.

FIG. 5A is a side cross-sectional view of a semiconductor package 20 according to an exemplary embodiment of the inventive concept.

Referring to FIG. 5A, the semiconductor package 20 may include a semiconductor substrate 22, an encapsulation member 26 encapsulating the semiconductor substrate 22, and a lead 24 electrically connected to the semiconductor substrate 22 and extending outward from the encapsulation member 26.

The semiconductor substrate 22 may be configured based on a semiconductor wafer. For example, the semiconductor substrate 22 may include a group IV material or a group III-V compound. More specifically, the semiconductor substrate 22 may include Si, SiC, SiGe, SiGeC, Ge alloys, GaAs, InAs, TnP, other group III-V or group II-VI compound semiconductors, or organic semiconductor substrates. In addition, the semiconductor substrate 22 may be formed using a single-crystal wafer such as a silicon single-crystal wafer in terms of a forming method. However, the semiconductor substrate 22 is not limited to the single-crystal wafer. An epitaxial wafer, a polished wafer, an annealed wafer, a silicon-on-insulator (SOI) wafer, or the like may be used as the semiconductor substrate 22. The epitaxial wafer refers to a wafer in which a crystalline material is grown on a single-crystal substrate.

In addition, an active surface of the semiconductor substrate 22 may include a plurality of circuit elements. Examples of the circuit elements may include an active element such as a transistor or a diode, and/or a passive element such as a capacitor or a resistor. Depending on a configuration, examples of the circuit elements may include at least one selected from among a system large scale integration (LSI), a logic circuit, an image sensor such as a CMOS imaging sensor (CIS), a memory device such as a flash memory, DRAM, SRAM, EEPROM, PRAM, MRAM, ReRAM, a high bandwidth memory (HBM), a hybrid memory cubic (HMC), and a microelectromechanical system (MEMS).

The semiconductor substrate 22 may be electrically connected to the lead 24. For example, the semiconductor substrate 22 may be electrically connected to the lead 24 through a bonding wire 25. The bonding wire 25 may be a gold (Au) or gold alloy wire, a silver (Ag) or silver alloy wire, a copper (Cu) or copper alloy wire, or a multilayer wire in which gold, platinum, or palladium is coated on copper.

Optionally, the semiconductor substrate 22 may be mounted on a package substrate 21. The package substrate 21 may be selected from among a substrate made of a conductive material such as a metal (e.g., copper (Cu)), a substrate made of a non-conductive material such as an epoxy, and a circuit substrate such as a printed circuit board (PCB). The package substrate 21 may be on substantially the same plane as at least a portion of the lead 24. For example, a region of the lead 24 that extends within the encapsulation member 26 may be on the same plane as the package substrate 21.

Since the encapsulation member has been described with reference to FIG. 1A or the like, a redundant description thereof will be omitted herein. The encapsulation member 26 may encapsulate the semiconductor substrate 22.

The semiconductor package 20 may have a first surface 26a and a second surface 26b that are substantially parallel to each other. The first surface 26a and the second surface 26b of the encapsulation member 26 may constitute an upper surface and a lower surface of the semiconductor package 20, respectively. Sides of the semiconductor package 20 may include a plurality of flat surfaces and/or curved surfaces, but is not particularly limited.

The lead 24 may be connected to the semiconductor substrate 22 so that the semiconductor substrate 22 is electrically connected to an external electronic device. The lead 24 may include copper (Cu), iron (Fe), nickel (Ni), manganese (Mn), cobalt (Co), chromium (Cr), gold (Au), silver (Ag), platinum (Pt), or alloys of two or more materials thereof.

One end of the lead 24 may be electrically connected to the semiconductor substrate 22, and the other end of the lead 24 may extend outward from the encapsulation member 26 and be exposed. As illustrated in FIG. 5A, the lead 24 may extend from the semiconductor substrate 22 in a direction parallel to the first surface 26a of the encapsulation member 26 immediately before the lead 24 is exposed to the outside of the encapsulation member 26.

A length L of a region of the lead 24 that extends to the outside of the encapsulation member 26 may be in the range of about 0.1 mm to about 3 mm. The length L of the region of the lead 24 that extends to the outside of the encapsulation member 26 may be appropriately adjusted according to the size or thickness of the semiconductor package 20.

The lead 24 may be configured not to deviate from a region between a plane of the first surface 26a of the encapsulation member 26 and a plane of the second surface 26b of the encapsulation member 26. In particular, the region of the lead 24 that extends to the outside of the encapsulation member 26 may exist only between the plane of the first surface 26a of the encapsulation member 26 and the plane of the second surface 26b of the encapsulation member 26.

As illustrated in FIG. 5A, a front end of the region of the lead 24 that is exposed to the outside of the encapsulation member 26 is located between the plane of the first surface 26a of the encapsulation member 26 and the plane of the second surface 26b of the encapsulation member 26. The front end is defined as a position of the lead 24 that is located farthest from the semiconductor substrate 22 with reference to a direction parallel to the first surface 26a of the encapsulation member 26.

In particular, the center of the front end 15d may be located near the central line 13 of the encapsulation member 26. That is, the center of the front end 15d may be located at a position that does not greatly deviate from the central line 13 the encapsulation member 26.

More specifically, the degree d of deviation of the center of the front end 15d from the central line of the encapsulation member 26 may be equal to or less than 30% (i.e., no greater than 30%) of a height H between the first surface 26a and the second surface 26b of the encapsulation member 26. By limiting the degree d of deviation of the center of the front end from the central line of the plane of the first surface 26a of the encapsulation member 26 and the plane of the second surface 16b of the encapsulation member 16, the effect of reducing the entire thickness of the electronic device will increase when the semiconductor package 20 is inserted into the opening of a substrate.

Figure 5B:
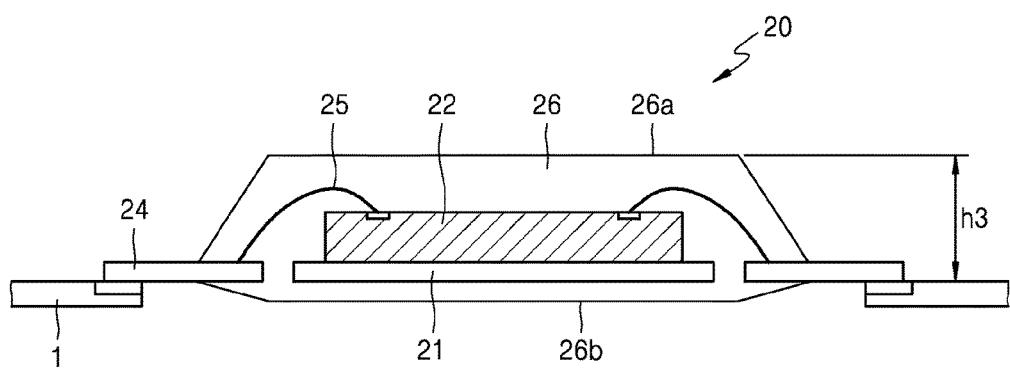
FIGS. 5B, 6B, 7B, and 8B are partial cross-sectional views illustrating states in which the semiconductor packages of FIGS. 5A, 6A, 7A, and 8A are connected to openings of substrates, respectively.

FIG. 5B is a partial cross-sectional view illustrating a state in which the semiconductor package 20 of FIG. 5A is disposed on the substrate 1.

Referring to FIG. 5B, the semiconductor package 20 may be inserted into the opening of the substrate 1, and leads 24 formed on both sides of the semiconductor package 20 may be connected to their corresponding terminals of the substrate 1. That is, the distal portions C of the leads 24 may be connected to their corresponding terminals 11 of the substrate 1.

As a result, a height h3 of the semiconductor package 20 protruding upward from the substrate 1 may be significantly lower than the total height H of the semiconductor package 20. In other words, the total height of the electronic device may be greatly reduced, as compared with the case of surface mounting or insertion mounting of the semiconductor package 20. As a result, an electronic device may be made slimmer.

Figure 6A:
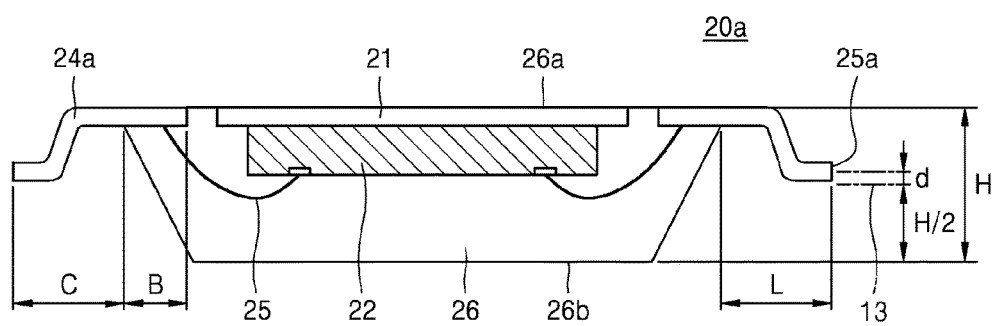

FIG. 6A is a side cross-sectional view of a semiconductor package 20a according to another exemplary embodiment of the inventive concept.

Referring to FIG. 6A, the package substrate 21 may form a portion of the first surface 26a of the encapsulation member 26. That is, the first surface 26a of the encapsulation member 26 may include an upper surface of the package substrate 21, an upper surface of the encapsulation member 26, and an upper surface of a portion of the lead 24a. When the package substrate 21 forms a portion of the first substrate 26a of the encapsulation member 26, there is no increase in thickness (that is, height) on a side opposite to a side where the semiconductor substrate 22 is located with respect to the package substrate 21. Thus, the semiconductor package 20a may be made slimmer.

As illustrated in FIG. 6A, the lead 24a may extend in a horizontal direction and may extend in a direction parallel to the first surface 26a (or the second surface 26b) of the encapsulation member 26 until the lead 24a extends outward from the encapsulation member 26 in a horizontal direction. After the lead 24a exits the encapsulation member 26 in the horizontal direction, the lead 24a may be bent toward the central line 13 between the first surface 26a and the second surface 26b of the encapsulation member 26. Thus, the lead 24a may have a gull-wing shape. Since the gull-wing shape has been described with reference to FIG. 2A, a detailed description thereof will be omitted herein. While the embodiment in which the front end of the lead 24a has the gull-wing shape has been illustrated, the configuration of the lead is not limited thereto. For example, the front end of the lead 24a may be bent to have a curved shape as illustrated in FIG. 4A. In another example, the front end of the lead 24a may be bent along a side of the encapsulation member 26 as Illustrated in FIG. 3A.

The front end of the lead 24a may extend in parallel to the first surface 26a (or the second surface 26b) of the encapsulation member 26. Since the lead 24a is formed to have the gull-wing shape, the center of the front end 25a of the lead 24a may be moved toward the second surface 26b of the encapsulation member 26, as compared with the lead 24a of a region to which the bonding wire 25 is connected.

In this embodiment, the degree d of deviation of the center of the front end 25a from the central line of the encapsulation member 26 may be equal to or less than 30% of a height H between the first surface 26a and the second surface 26b of the encapsulation member 26.

A distance L measured in a direction parallel to the first surface 26a of the encapsulation member 26 between a point where the lead 24a to exits the encapsulation member 26 and the front end of the lead may be in the range of about 0.1 mm to about 3 mm.

Figure 6B:
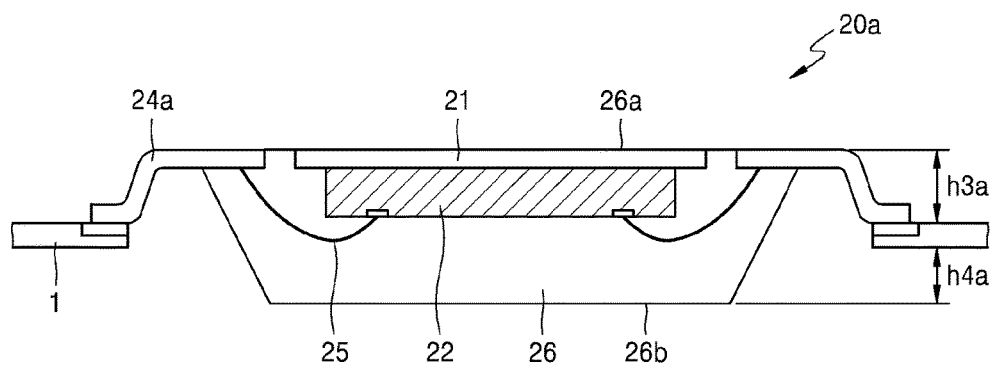

FIG. 6B is a partial cross-sectional view illustrating a state in which the semiconductor package 20a of FIG. 6A is disposed on the substrate 1.

Referring to FIG. 6B, the semiconductor package 20a may be inserted into the opening of the substrate 1, and leads 24a formed on both sides of the semiconductor package 20a may be connected to their corresponding terminals of the substrate 1. That is, the distal portions C of the leads 24a may be connected to their corresponding terminals 11 of the substrate 1.

As a result, a height h3a of the semiconductor package 20a protruding upward from the substrate 1 and a height h4a of the semiconductor package 20a protruding downward from the substrate 1 may be equal to or less than half a total height H of the semiconductor package 20a. In other words, the total height of the electronic device may be greatly reduced, as compared with the case of surface mounting or insertion mounting of the semiconductor package 20a. As a result, an electronic device may be made slimmer In particular, by appropriately adjusting the vertically extending length of the gull-wing shape according to the position at which the lead 24a starts to exits the encapsulation member 26 in a direction parallel to the first surface 26a of the encapsulation member 26, the height h3a of the semiconductor package 20a protruding upward from the substrate 1 may be set to be substantially equal to or similar to the height h4a of the semiconductor package 20a protruding upward from the substrate 1. Since the height h3a of the semiconductor package 20a protruding upward from the substrate 1 is made to be substantially equal to the height h4a of the semiconductor package 20a protruding downward from the substrate 1, a vertical symmetry of an electronic device to be manufactured may be achieved or improved.

Figure 7A:
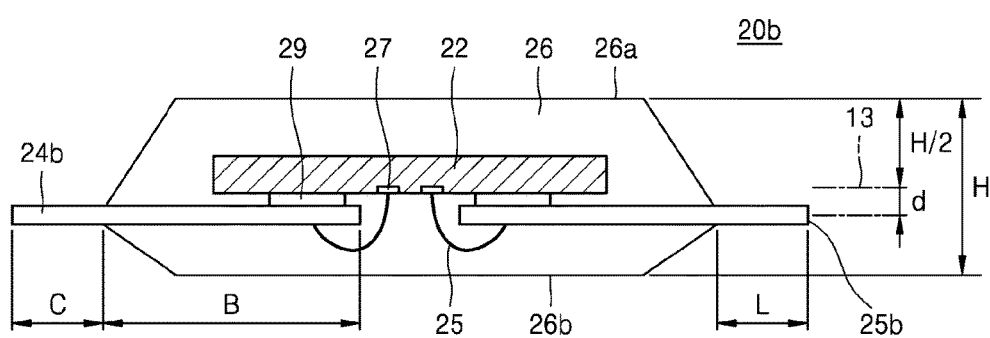

FIG. 7A is a side cross-sectional view of a semiconductor package 20b according to another exemplary embodiment.

Referring to FIG. 7A, a lead 24b extends in parallel to the first surface 26a of the encapsulation member 26 without a package substrate for mounting the semiconductor substrate 22. A bonding pad 27 of the semiconductor substrate 22 may be provided with one row or two rows along the central line of the semiconductor substrate 22 or adjacent to the central line of the semiconductor substrate 22. In addition, the bonding pad 27 of the semiconductor substrate 22 may be directly wire-bonded with the lead 24b horizontally extending near to the bonding pad through the bonding wire 25.

The leads 24b may be attached to the semiconductor substrate 22 through a separate binder 29 disposed between the lead 24b and the semiconductor substrate 22. The binder 29 may be an epoxy resin.

A portion of the lead 24b inside the encapsulation member 26 may overlap with a portion of the semiconductor substrate. The lead 24b may extend from the encapsulation member 26 to the front end in parallel to the first surface 26a (or the second surface 26b) of the encapsulation member 26. The degree d of deviation of the center of the front end 25b of the lead 24b from the central line 13 of the encapsulation member 26 may be equal to or less than 30% of a height H between the first surface 26a and the second surface 26b of the encapsulation member 26.

In addition, a distance L measured in a direction parallel to the first surface 26a of the encapsulation member 26 between a point where the lead 24b to exits the encapsulation member 26 and the front end of the lead may be in the range of about 0.1 mm to about 3 mm.

Figure 7B:
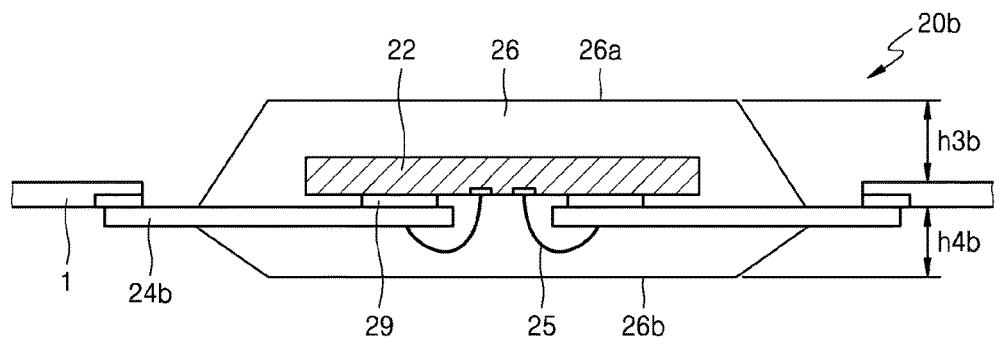

FIG. 7B is a partial cross-sectional view illustrating a state in which the semiconductor package 20b of FIG. 7A is disposed on the substrate 1.

Referring to FIG. 7B, the semiconductor package 20b may be inserted into the opening of the substrate 1, and leads 24b formed on both sides of the semiconductor package 20b may be connected to their corresponding terminals of the substrate 1. That is, the distal portions C of the leads 24b may be connected to their corresponding terminals 11 of the substrate 1.

In some embodiments, a height h3b of the semiconductor package 20b protruding upward from the substrate 1 and a height h4b of the semiconductor package 20b protruding downward from the substrate 1 may be substantially equal to half a total height H of the semiconductor package 20b. In other embodiment, a height h3b of the semiconductor package 20b protruding upward from the substrate 1 or a height h4b of the semiconductor package 20b protruding downward from the substrate 1 may be smaller than half a total height H of the semiconductor package 20b. In other words, the total height of the electronic device may be greatly reduced, as compared with the case of surface mounting or insertion mounting of the semiconductor package 20b. As a result, an electronic device may be made slimmer In particular, since the package substrate is not used, it is possible to mount the semiconductor package 20b to have the height reduced by a thickness of the package substrate.

Figure 8A:
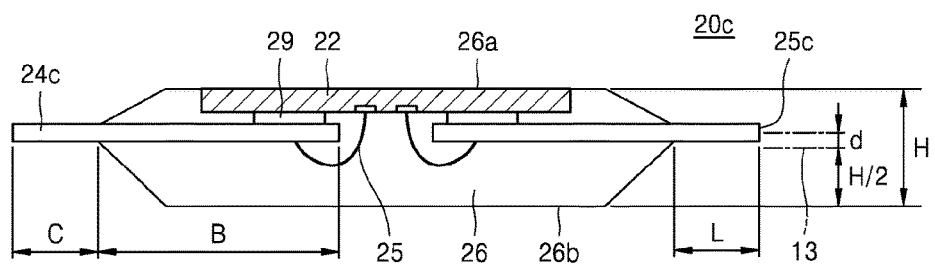

FIG. 8A is a side cross-sectional view of a semiconductor package 20c according to another exemplary embodiment.

The semiconductor package 20c of FIG. 8A is substantially identical to the semiconductor package 20b of FIG. 7A in that a lead 24c extends in parallel to the first surface 26a of the encapsulation member 26 without a package substrate for mounting the semiconductor substrate 22. However, a portion of the semiconductor substrate 22 may form a portion of the first surface 26a of the encapsulation member 26. That is, as illustrated in FIG. 8A, a portion of the semiconductor substrate 22 may be exposed in the first surface 26a of the encapsulation member 26.

The leads 24c may be attached to the semiconductor substrate 22 through a separate binder 29. The binder 29 may be epoxy resin.

The lead 24c may extend from the encapsulation member 26 to the front end in parallel to the first surface 26a (or the second surface 26b) of the encapsulation member 26. At this time, the degree d of deviation of the center of the front end 25c of the lead from the central line of the encapsulation member 26 may be equal to or less than 30% of a height H between the first surface 26a and the second surface 26b of the encapsulation member 26.

In addition, a distance L measured in a direction parallel to the first surface 26a of the encapsulation member 26 between a point where the lead 24c to exits the encapsulation member 26 and the front end of the lead may be in the range of about 0.1 mm to about 3 mm.

Figure 8B:
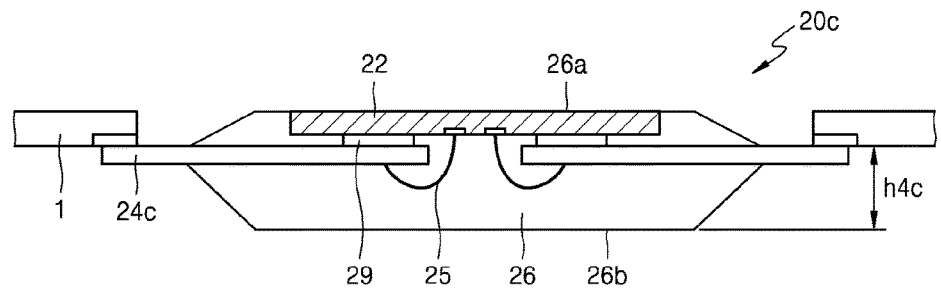

FIG. 8B is a partial cross-sectional view illustrating a state in which the semiconductor package 20c of FIG. 8A is disposed the substrate 1.

Referring to FIG. 8B, the semiconductor package 20c may be inserted into the opening of the substrate 1, and leads 24c formed on both sides of the semiconductor package 20c may be connected to their corresponding terminals of the substrate 1. That is, the distal portions C of the leads 24c may be connected to their corresponding terminals 11 of the substrate 1.

As a result, the upper surface of the substrate 1 may be disposed on substantially the same plane as the first surface 26a of the semiconductor package 20b without protruding upward from the substrate 1. In addition, a height h4c of the semiconductor package 20c protruding downward from the substrate 1 may be significantly lower than the total height H of the semiconductor package 20c. In particular, a package substrate may be omitted and one surface of the semiconductor substrate 22 may be exposed. In such a manner, the total height of the semiconductor package 20c is very low. Thus, it is possible to manufacture an electronic device having a very small protruding height h4c and a very small thickness. It should be appreciated that the electronic component and the semiconductor package of the present inventive concept are not limited to the illustrated embodiments. For example, a distal portion of the lead of the electronic component and the semiconductor package may be configured to any shape so that a surface of the electronic component and the semiconductor package may protrude from a surface of the substrate in a desired height.

Figure 9:
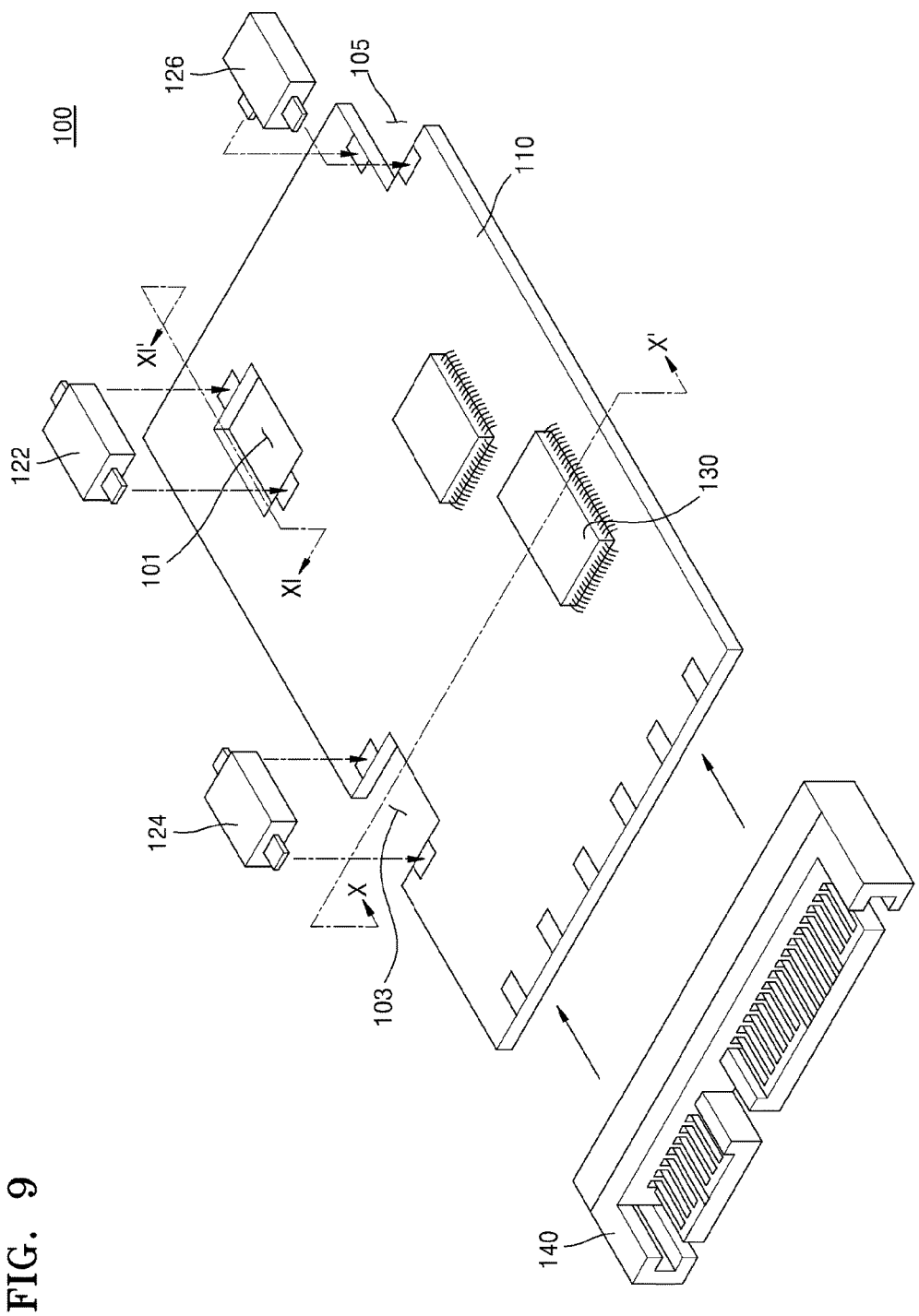
FIG. 9 is an exploded perspective view of an electronic device according to an exemplary embodiment of the inventive concept.
Figure 10:
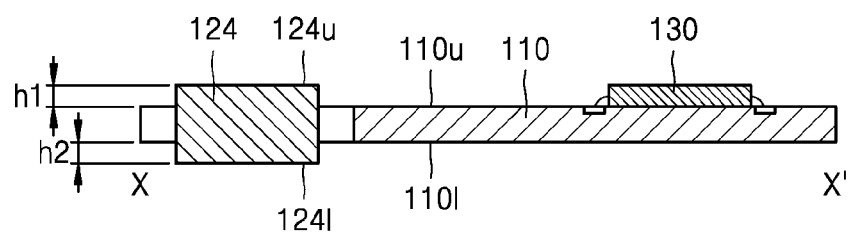
FIG. 10 is a side sectional view taken along line X-X' of FIG. 9.

FIG. 9 is an exploded perspective view of an electronic device 100 according to an exemplary embodiment of the inventive concept. FIG. 10 is a side sectional view taken along line X-X' of FIG. 9.

Referring to FIGS. 9 and 10, a substrate 110 having an upper surface 110u and a lower surface 110l facing each other is provided. The substrate 110 may be a PCB or a flexible PCB. However, the exemplary embodiment of the inventive concept is not limited thereto.

The substrate 110 may include an opening 101 and/or recesses 103 and 105. The opening 101 passes through the substrate 110. That is, the opening 101 is surrounded by the substrate 110 and defined thereby. The opening 101 may have a rectangular shape, but is not limited thereto. When the opening 101 has a rectangular shape, four edges of the rectangle are all a portion of the substrate 110.

The recesses 103 and 105 are portions that are recessed toward the inside of the substrate 110 in a direction parallel to the upper surface 110u of the substrate 110. In some embodiments, the thickness of the recess is small than a thickness of the substrate such that a lower portion of the substrate forms a bottom surface of the recess. In other embodiments, the recesses 103 and 105 may pass through the substrate 110 and recessed toward inside of the substrate 110 away from an edge of the substrate 110. In some embodiments, the recess 103 and 105 may have an L shape or a C shape. When the recess 105 has an L shape, the recess 105 may have two straight-line edges. When the recess 103 has a C shape, the recess 103 may have three straight-line edges. However, the recesses 103 and 105 are not limited thereto and may have various shapes.

Electronic components 122, 124, and 126 are mounted in the opening 101 and the recesses 103 and 105 of the substrate 110. The electronic components 122, 124, and 126 may be electronic components 10, 10a, 10b, and 10c of FIGS. 1A, 2A, 3A, and 4A.

The electronic component 124 mounted on the recess 103 may have a first surface 124u and a second surface 124l facing each other. In particular, the first surface 124u of the electronic component 124 may be parallel to the second surface 124l of the electronic component 124.

The electronic components 124 and 126 mounted on the recesses 103 and 105 may be at least partially accommodated in the recesses 103 and 105, respectively. Terminals, which are electrically connectable to the electronic components 124 and 126, may be provided at edges of the recesses 103 and 105.

The electronic components 124 and 126 may have leads or tabs that are electrically connected to the terminals. The leads or the tabs may protrude from the electronic components 124 and 126 in a lateral direction and may have various shapes. For example, the leads or the tabs may have a straight-line shape, a curved shape, or a gull-wing shape. However, the exemplary embodiment of the inventive concept is not limited thereto. A connection between the terminals and the leads or the tabs will be described below in more detail.

As illustrated in FIG. 10, the first surface 124u of the electronic component 124 may protrude outward from the upper surface 110u of the substrate 110 by a height h1. In addition, the second surface 124l of the electronic component 124 may protrude outward from the lower surface 110l of the substrate 110 by a height h2.

The height h1 at which the first surface 124u of the electronic component 124 protrudes may be substantially equal to the height h2 at which the second surface 124l of the electronic component 124 protrudes. Since the height h1 and the height h2 are made to be substantially equal to each other, a vertical symmetry of an electronic device to be manufactured may be achieved or improved.

As illustrated in FIG. 9, a semiconductor device 130 may be mounted on the upper surface 110u of the substrate 10. Two or more semiconductor devices 130 may be provided. The semiconductor device 130 may be a logic device or a memory device.

In addition, the electronic device 100 may further include an interface terminal 140 for interface with an external device. The interface terminal 140 may be configured to transmit or receive a signal to or from an external device in accordance with a serial advanced technology attachment (SATA) standard, a parallel advanced technology attachment (PATA) standard, or a small computer system interface (SCSI) standard in association with the electrical configuration and dimension of the interface terminal 140. The SATA standard may include all types of SATA-based standards such as SATA-1, SATA-2, SATA-3, or external SATA (e-SATA). The PATA standard may include all types of integrated drive electronics (IDE)-based standards such as IDE or enhanced-IDE (E-IDE). In addition, the interface terminal 140 may be configured to transmit or receive a signal to or from an external device in accordance with a peripheral component interconnect (PCI) interface standard or a PCI express interface standard. Furthermore, the interface terminal 140 may be configured to transmit or receive a signal to or from an external device in accordance with a serial attached SCSI (SAS) standard.

Figure 11:
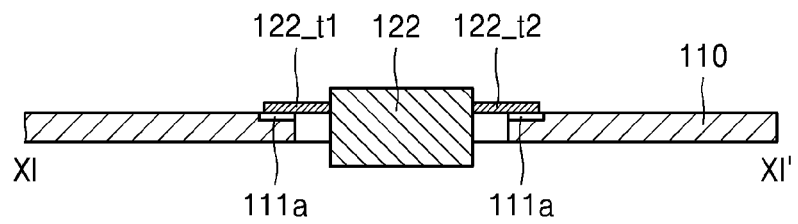
FIG. 11 is a side sectional view taken along line XI-XI' of FIG. 9.

FIG. 11 is a side sectional view taken along line XI-XI' of FIG. 9.

Referring to FIGS. 9 and 11, the electronic component 122 is mounted in the opening 101. More specifically, the substrate 110 includes the opening 101 that allows at least a portion of the electronic component 122 to pass through the substrate 110.

Terminals 111a and 111b, which are electrically connectable to the electronic component 122, may be provided in at least some of the edges of the opening 101.

In addition, the electronic component 122 may include tabs 122_t1 and 122_t2 for electrical connection to the terminals 111a and 111b. The tabs 122_t1 and 122_t2 may protrude from the electronic component 122 in a lateral direction and may have various shapes. For example, the tabs 122_t1 and 122_t2 may have a straight-line shape, a curved shape, or a gull-wing shape.

As illustrated in FIG. 11, the terminals 111a and 111b may be provided on the upper surface of the substrate 110, and the tabs 122_t1 and 122_t2 may be mounted on the terminals 111a and 111b, respectively. In addition, the terminals 111a and 111b and the tabs 122_t1 and 122_t2 may be mutually connected by a conductive material such as a solder paste.

Figure 12:
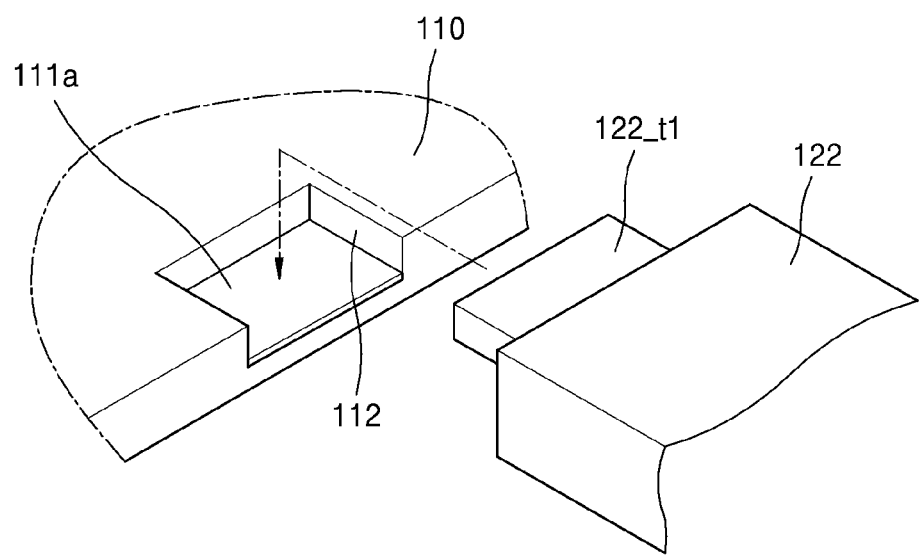
FIG. 12 is a partial perspective view illustrating a connection between a tab and a terminal according to another exemplary embodiment of the inventive concept.
Figure 13:
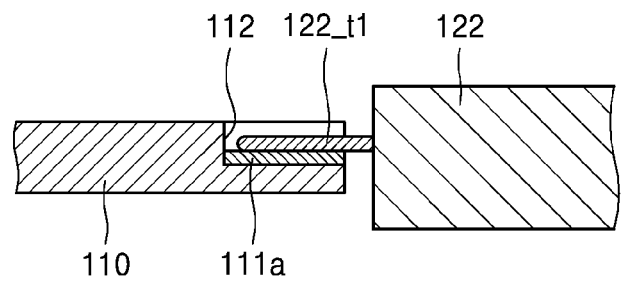
FIG. 13 is a side sectional view of a cross-section taken along a center of the tab and the terminal of FIG. 12.

FIG. 12 is a partial perspective view illustrating the connection between the tab 122_t1 and the terminal 111a according to another exemplary embodiment. FIG. 13 is a side sectional view of a cross-section taken along the center of the tab 122_t1 and the terminal 111a of FIG. 12.

Referring to FIGS. 12 and 13, the substrate 110 may include a notched portion 112 capable of accommodating the tab 122_t1 of the electronic component 122. The terminal 111a that is connectable to the tab 122_t1 may be disposed in the notched portion 112.

The tab 122_t1 of the electronic component 122 may be connected in contact with the terminal 111a in the notched portion 112. In this configuration, the electronic component 122 may be disposed at a position that is lower by a depth of the notched portion 112. Thus, it is possible to cope with a case where the electronic component 122 needs to be disposed through the opening 101 at a position that is much lower than the case of FIG. 11. In addition, as illustrated in FIG. 13, the tab 122_t1 does not protrude over the substrate 110, thus achieving a more stable connection.

Figure 14A:
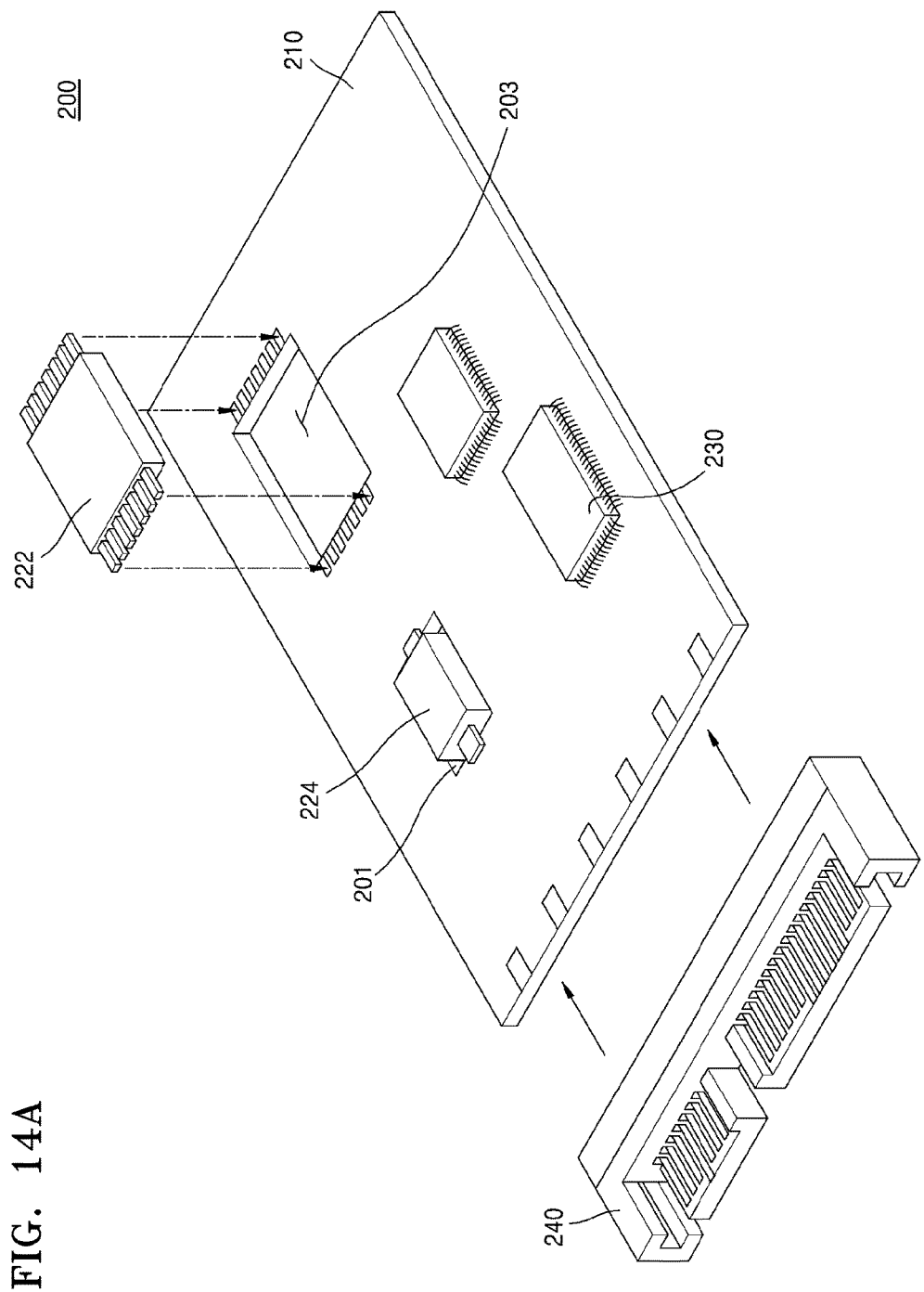
FIGS. 14A and 14B are exploded perspective views of electronic devices according to exemplary embodiments of the inventive concept.

FIG. 14A is an exploded perspective view of an electronic device 200 according to another exemplary embodiment of the inventive concept. The electronic device 200 of FIG. 14A differs from the electronic device 100 of FIG. 9 in that a semiconductor package 222 is accommodated in an opening 203. The semiconductor package 222 may be one of the semiconductor packages 20, 20a, 20b, and 20c of FIGS. 5A, 6A, 7A, and 8A.

In addition, the opening 203 may allow at least a portion of the semiconductor package 222 to pass through the substrate 210.

The semiconductor package 222 may include a plurality of leads extending in parallel to an upper surface of the substrate 210. In addition, a plurality of terminals corresponding to the plurality of leads may be provided along edges of the opening 101.

While the semiconductor package 222 is illustrated in FIG. 14A as being accommodated in the opening 203, the substrate 210 may include a recess and a semiconductor package may be accommodated in the recess.

A bottom surface of the semiconductor package 222 may pass through a bottom surface of the substrate 210 and protrude outward from the substrate 210.

In addition, in the same manner as that in FIG. 9, an electronic component 224 may be additionally mounted in another opening 201. Furthermore, one or more semiconductor devices 230 may be mounted on the substrate 210. The semiconductor device 230 may be a logic device or a memory device.

In FIG. 14A, the electronic component 224 may be a capacitor and the may be configured to supply a backup voltage to the semiconductor package 222 mounted on the substrate 210. That is, the semiconductor package 222 may be configured to receive external power through an interface terminal 240 and receive power from the electronic component 224 when the external power is abnormally shut off. While receiving the power from the electronic component 224, the semiconductor package 222 may perform an operation of protecting data, for example, an operation of storing data in a nonvolatile storage medium.

In order to secure sufficient time to perform such an operation, the capacity of the electronic component 224 being a capacitor needs to be sufficiently high. Since a high-capacity capacitor has a high vertical height, it is difficult to obtain a slim electronic device in the case of surface mounting. When a plurality of low-capacity capacitors are mounted in lieu of the high-capacity capacitor so as to obtain a slim electronic device, the capacitors occupy a considerable footprint, which runs counter to the size reduction trend. However, as illustrated in FIGS. 9 and 14A, the openings 101, 103, 105, and 201 are formed in the substrates 110 and 210 and the high-capacity electronic component 224 is accommodated in the openings 101, 103, 105, and 201, thereby saving a footprint while obtaining a slim electronic device.

Figure 14B:
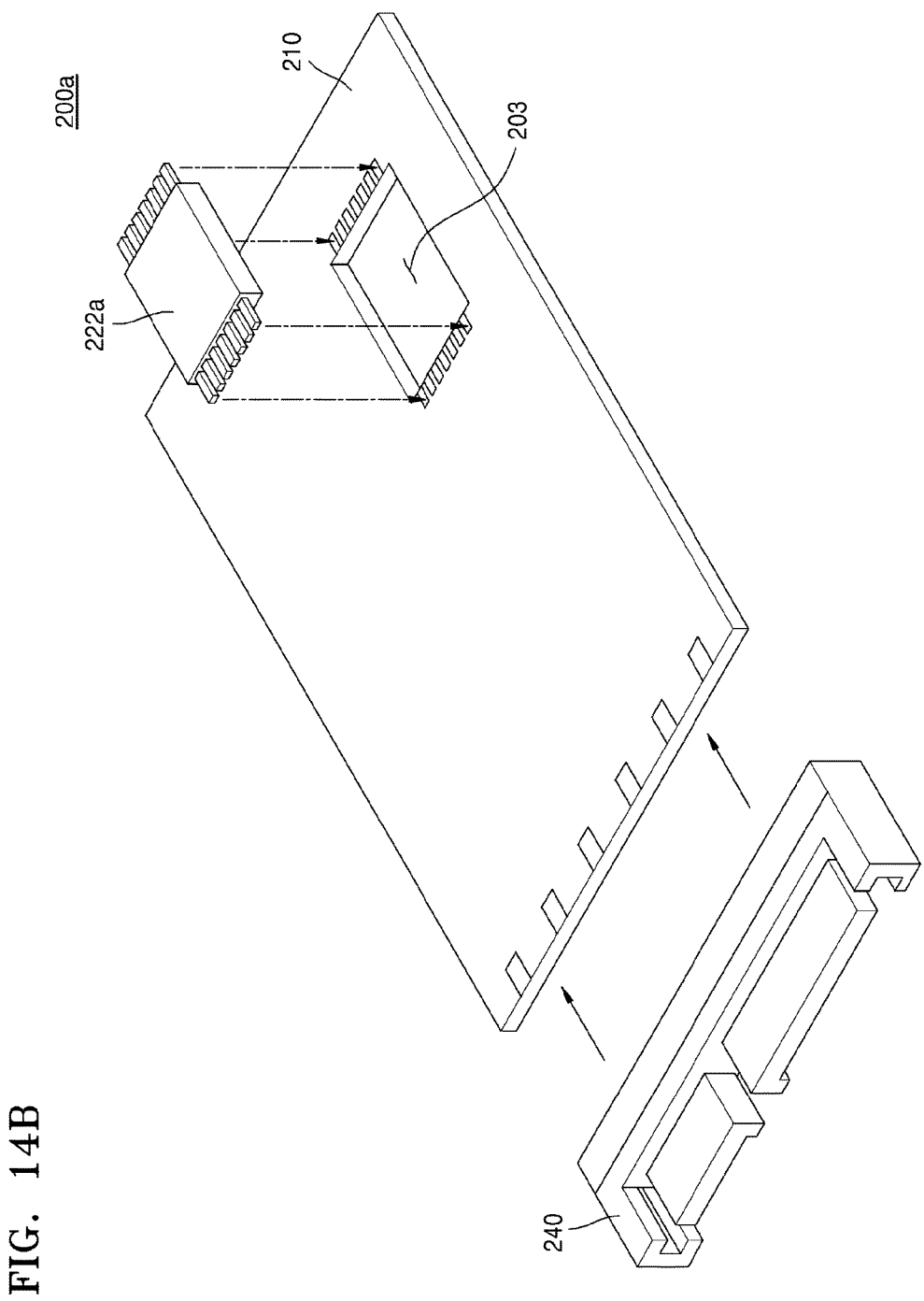

FIG. 14B is an exploded perspective view of an electronic device 200a according to another exemplary embodiment of the inventive concept. FIG. 14B illustrates that a semiconductor package 222a is mountable on a bottom surface of a substrate 210, unlike in the case of FIG. 14A.

Although the exemplary embodiments of FIGS. 14A and 14B are illustrated in separate drawings, the two exemplary embodiments may be combined. That is, a plurality of semiconductor packages 222 and 222a may be stacked in one opening 203 of the substrate 210 toward both sides of the substrate 210. Alternatively, a plurality of openings may be formed in the substrate 210, the semiconductor package 222 may be mounted on the upper surface of the substrate with respect to some of the openings, and the semiconductor package 222a may be mounted on the bottom surface of the substrate with respect to the others.

Figure 15A:
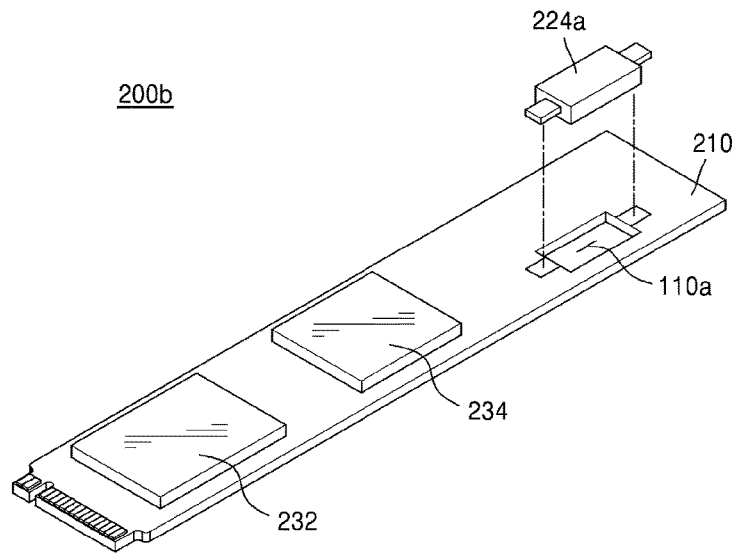
FIGS. 15A to 15C are exploded perspective views of electronic devices according to exemplary embodiments of the inventive concept.
Figure 15B:
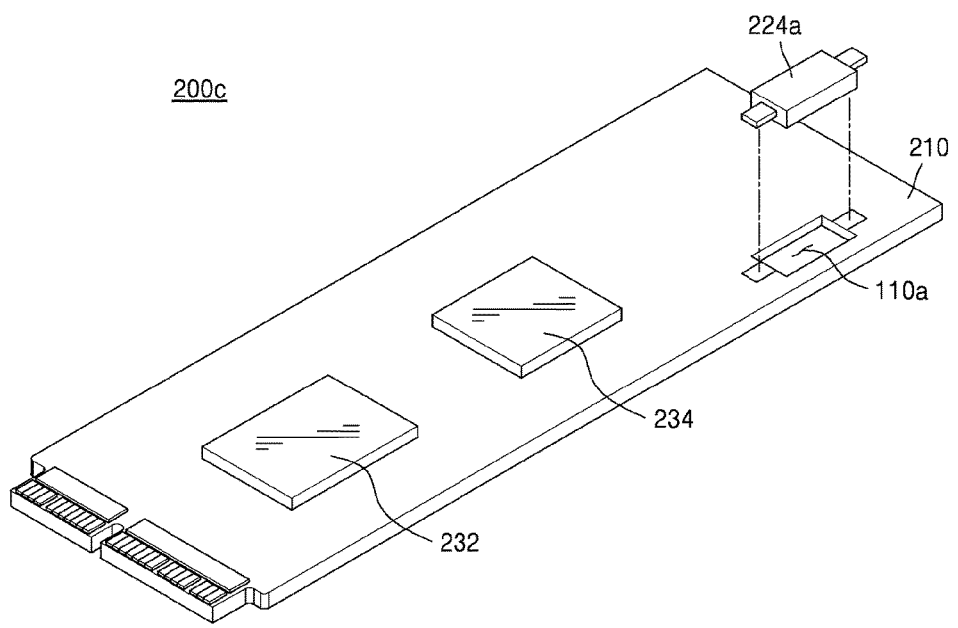
Figure 15C:
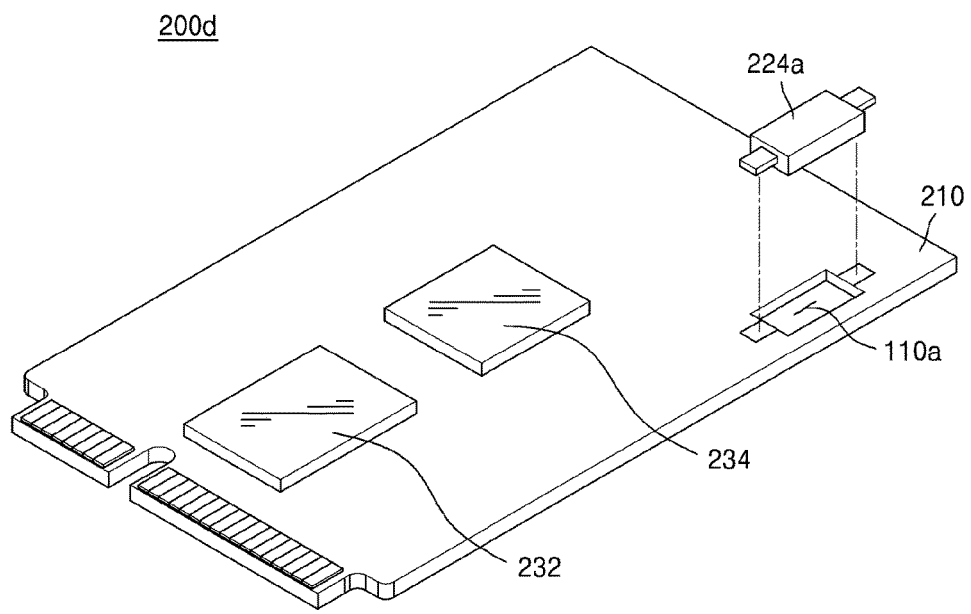

FIGS. 15A to 15C are exploded perspective views of electronic devices 200b, 200c, and 200d according to exemplary embodiments of the inventive concept.

Referring to FIGS. 15A to 15C, a controller 232 and a memory package 234 may be mounted on a substrate 210. The controller 232 and the memory package 234 may have a difference in an interface with an external device and may have an M2 interface, a GS3N interface, or an mSATA interface. In particular, the interface and the substrate 210 may form a one body. However, the exemplary embodiment of the inventive concept is not limited thereto.

Figure 16:
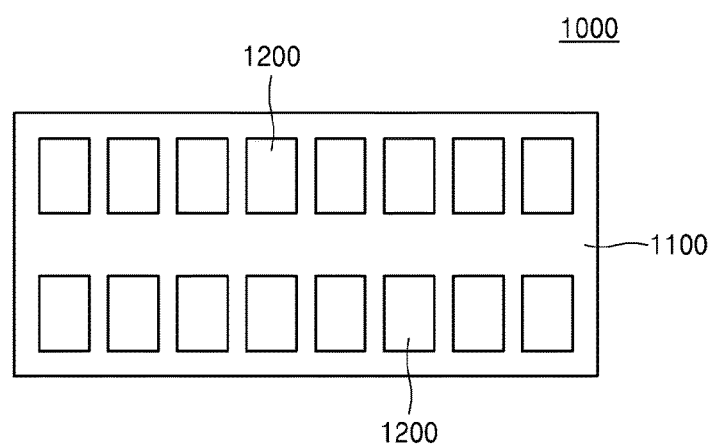
FIG. 16 is a plan view of a memory module including an electronic component or a semiconductor package, according to an exemplary embodiment of the inventive concept.

An electronic component 224a is illustrated in FIGS. 15A to 15C as being mounted in the opening 101a, but it will be understood by those skilled in the art that the controller 232 or the memory package 234 can be mounted in the same manner FIG. 16 is a plan view of a memory module 1000 including an electronic component or a semiconductor package, according to an exemplary embodiment of the inventive concept.

Specifically, the memory module 1000 may include a PCB 1100 and a plurality of semiconductor packages 1200.

The plurality of semiconductor packages 1200 may include the semiconductor packages and/or the electronic components according to the exemplary embodiments of the inventive concept. In particular, the plurality of semiconductor packages 1200 may be at least one selected from among the above-described semiconductor packages according to the exemplary embodiments of the inventive concept.

The memory module 100 according to the exemplary embodiment of the inventive concept may be a single in-line memory module (SIMM) in which the plurality of semiconductor packages 1200 are mounted on only one surface of the PCB 1000, or a dual in-line memory module (DIMM) in which the plurality of semiconductor packages 1200 are arranged on both sides of the PCB 1000. In addition, the memory module 1000 according to the exemplary embodiment of the inventive concept may be a fully buffered DIMM (FBDIMM) including an advanced memory buffer (AMB) that provides external signals to the plurality of semiconductor packages 1200.

Figure 17:
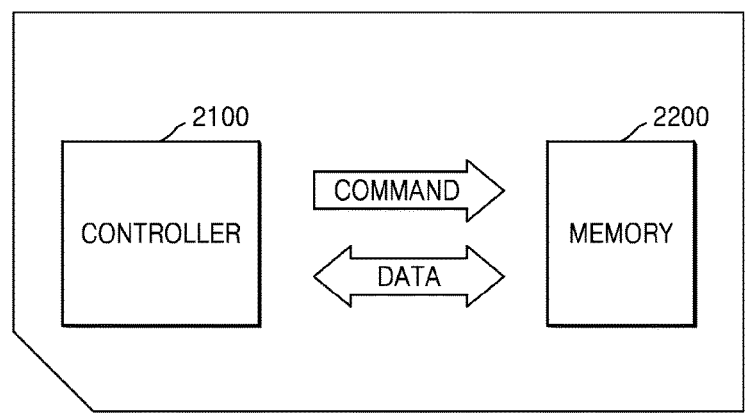
FIG. 17 is a block diagram of a memory card including an electronic component or a semiconductor package, according to an exemplary embodiment of the inventive concept.

FIG. 17 is a block diagram of a memory card 2000 including an electronic component or a semiconductor package, according to an exemplary embodiment of the inventive concept.

Specifically, the memory card 2000 may be configured such that a controller 2100 and a memory 2200 exchange electric signals with each other. For example, when the controller 2100 issues a command, the memory 2200 may transmit data.

The memory 2200 may include the electronic components and/or the semiconductor packages according to the exemplary embodiments of the inventive concept. In particular, the memory 2200 may be at least one selected from among the above-described semiconductor packages according to the exemplary embodiment of the inventive concept.

The memory card 2000 may include various types of memory cards, for example, a memory stick card, a smart media (SM) card, a secure digital (SD) card, a mini SD card, or a multimedia card (MMC).

Figure 18:
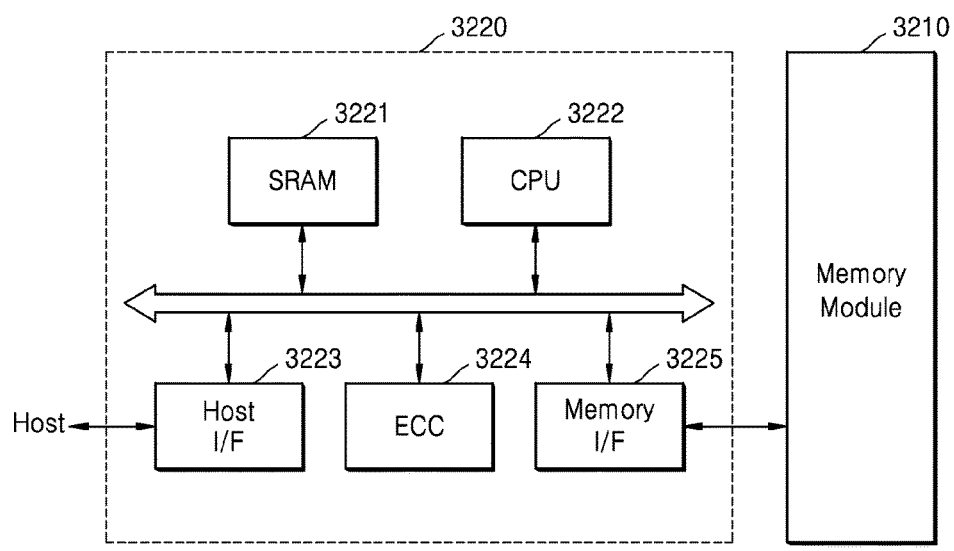
FIG. 18 is a block diagram of a memory device including an electronic component or a semiconductor package, according to an exemplary embodiment of the inventive concept.

FIG. 18 is a block diagram of a memory device 3200 including an electronic component or a semiconductor package, according to an exemplary embodiment of the inventive concept.

Referring to FIG. 18, the memory device 3200 according to the exemplary embodiment of the inventive concept includes a memory module 3210. The memory module 3210 may include at least one selected from among the electronic components and the semiconductor packages according to the above-described exemplary embodiments. In addition, the memory module 3210 may further include other types of semiconductor storage devices (for example, nonvolatile storage devices and/or SRAM devices). The memory device 3200 may include a memory controller 3220 that controls data exchange between a host and the memory module 3210.

The memory controller 3220 may include a processing unit 3222 that controls an overall operation of a memory card. In addition, the memory controller 3220 may include SRAM 3221 used as a working memory of the processing unit 3222. The memory controller 3220 may further include a host interface 3223 and a memory interface 3225. The host interface 3223 may include a data exchange protocol between the memory device 3200 and the host. The memory interface 3225 may connect the memory controller 3220 to the memory module 3210. In addition, the memory controller 3220 may further include an error correction code (ECC) block 3224. The ECC block 3224 may detect and correct an error of data read from the memory module 3210. Although not illustrated, the memory device 3200 may further include a ROM device that stores code data for interfacing with the host. The memory device 3200 may be a solid state drive (SSD) that can replace a hard disk of a computer system.

Figure 19:
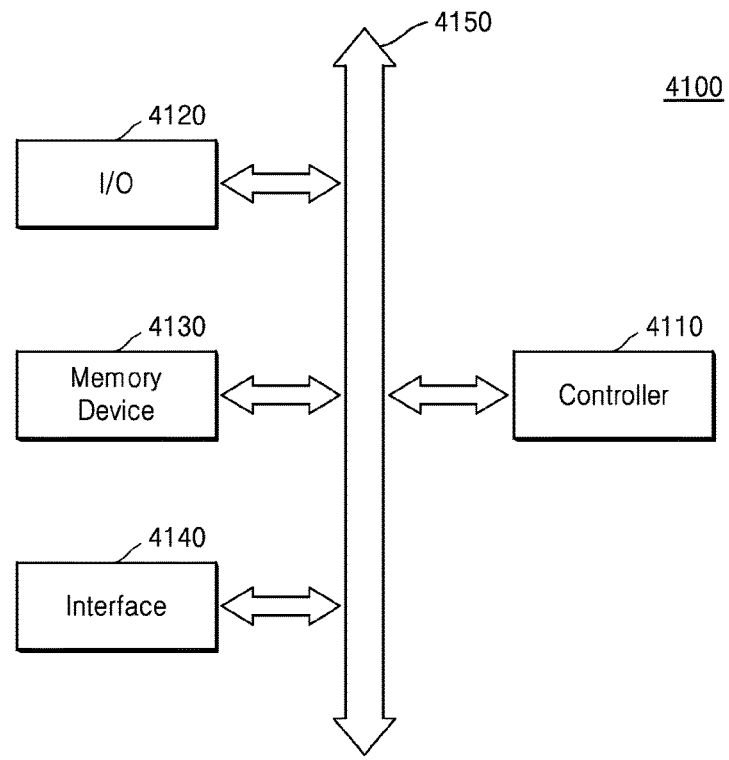
FIG. 19 is a block diagram of an electronic system including an electronic component or a semiconductor package, according to an exemplary embodiment of the inventive concept.

FIG. 19 is a block diagram of an electronic system 4100 including an electronic component or a semiconductor package, according to an exemplary embodiment of the inventive concept.

Referring to FIG. 19, the electronic system 4100 according to the exemplary embodiment of the inventive concept may include a controller 4110, an input/output (I/O) device 4120, a memory device 4130, an interface 4140, and a bus 4150. The controller 4110, the I/O device 4120, the memory device 4130, and/or the interface 4140 may be connected together through the bus 4150. The bus 4150 corresponds to a data transmission path.

The controller 4110 may include at least one selected from among a microprocessor, a digital signal processor, a microcontroller, and logic devices capable of performing functions similar thereto. The I/O device 4120 may include a keypad, a keyboard, or a display. The memory device 4130 may store data and/or commands. At least one of the controller 4110, the I/O device 4120, the memory device 4130, and the interface 4140 may include at least one selected from among the electronic components and the semiconductor packages according to the above-described exemplary embodiment. In addition, the memory device 4130 may further include other types of semiconductor memory devices (for example, nonvolatile memory devices and/or SRAM devices). The interface 4140 may perform a function of transmitting data to a communication network or receiving data from the communication network. The interface 4140 may be a wired or wireless interface. For example, the interface 4140 may include an antenna or a wired/wireless transceiver. Although not illustrated, the electronic system 4100 may further include high-speed DRAM devices and/or SRAM devices as a working memory device for improving the operation of the controller 4110.

The electronic system 4100 may be applied to a personal digital assistant (PDA), a portable computer, a web tablet, a wireless phone, a mobile phone, a digital music player, a memory card, or any type of electronic products capable of transmitting and/or receiving information in a wireless environment.

Figure 20:
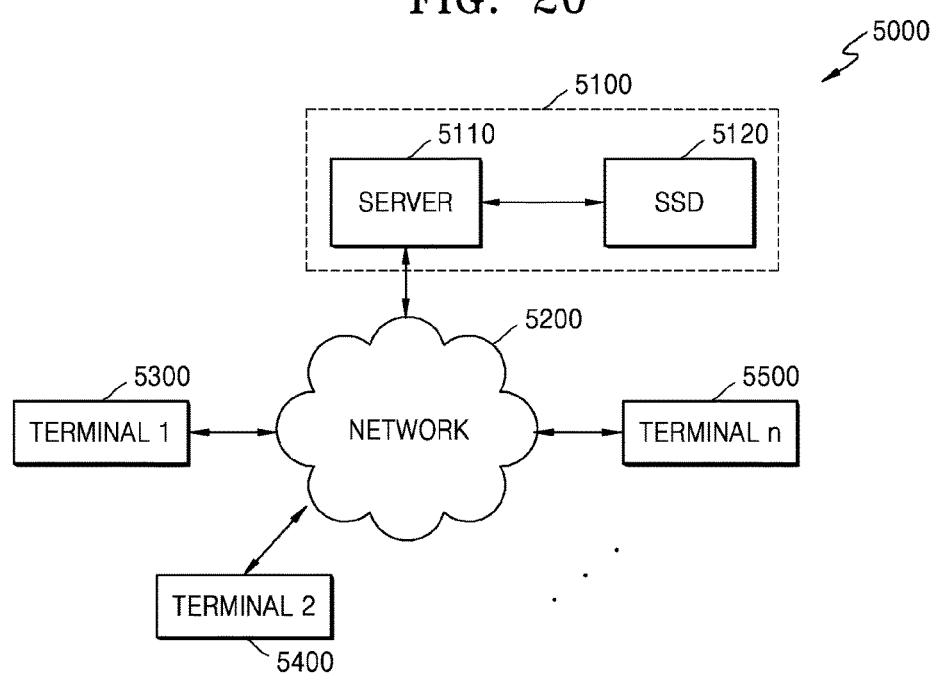
FIG. 20 is a block diagram of a network configuration for a server system including an electronic component or a semiconductor package, according to an exemplary embodiment of the inventive concept.

FIG. 20 is a block diagram of a network configuration for a server system 5100 including an electronic component or a semiconductor package, according to an exemplary embodiment of the inventive concept.

Referring to FIG. 20, a network system 5000 according to an exemplary embodiment of the inventive concept may include the server system 5100 and a plurality of terminals 5300, 5400, and 5500, which are connected together through a network 5200. The server system 5100 according to the exemplary embodiment of the inventive concept may include a server 5110 that processes a request received from the plurality of terminals 5300, 5400, and 5500 connected to the network 5200, and an electronic device 5120 that stores data corresponding to the request received from the plurality of terminals 5300, 5400, and 5500. The electronic device 5120 may be the electronic components of FIGS. 1A to 4B or the semiconductor packages of FIGS. 5A to 8B. For example, the electronic device 5120 may be a solid state disk (SSD).

On the other hand, the semiconductor device according to the exemplary embodiment of the inventive concept may be mounted using various types of packages. For example, the semiconductor device according to the exemplary embodiment of the inventive concept may be mounted using package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP).

The use of the electronic component and/or the semiconductor package according to the exemplary embodiments of the inventive concept makes it possible to manufacture a slimmer electronic device while maintaining excellent performance.

While the inventive concept has been particularly shown and described with reference to exemplary embodiments thereof, it will be understood that various changes in form and details may be made therein without departing from the spirit and scope of the following claims.

What is claimed is:
1. An electronic device comprising:
a substrate having an upper surface and a lower surface facing each other; and
an electronic component having a first surface and a second surface facing each other and mounted on the substrate, the electronic component including:
an electronic element;
an encapsulation member that encapsulates the electronic element and has a first surface and a second surface facing to each other,
wherein a height of the encapsulation member is a distance between the first surface and the second surface, and
wherein a central line of the encapsulation member is located equidistant from the first surface and the second surface; and
a lead electrically connected to the electronic element and extending outward from the encapsulation member,
wherein the lead is disposed entirely in a region between a plane of the first surface of the encapsulation member and a plane of the second surface of the encapsulation member, and
wherein the electronic component is mounted in an opening that is formed in the substrate and passes through the substrate and at least a portion of the electronic component passes through the substrate.
2. The electronic device of claim 1,
wherein the lead inside the encapsulation member extends from the electronic element in a direction substantially parallel to the first surface of the encapsulation member.
3. The electronic device of claim 1,
wherein a degree of deviation of a center of a front end of the lead from the central line of the encapsulation member is no greater than 30% of the height of the encapsulation member, wherein the front end of the lead is located farthest from the electronic element in a direction substantially parallel to the first surface of the encapsulation member.
4. The electronic device of claim 1,
wherein the electronic element is a capacitor, a resistor, an inductor, or a combination of two or more thereof.
5. The electronic device of claim 1,
wherein a distal portion of the lead, exposed outside of the encapsulation member, is bent toward the plane of the first or second surface of the encapsulation member to form a curved-shaped region.
6. The electronic device of claim 5,
wherein a distance between a center of a front end of the lead and a point on the curved-shaped region that is farthest away from the center of the front end of the lead is no greater than 30% of the height of the encapsulation member,
wherein the front end of the lead is located farthest from the electronic element in a direction substantially parallel to the first surface of the encapsulation member.
7. The electronic device of claim 1,
wherein a distance measured in a direction parallel to the first surface of the encapsulation member between a point where the lead exits the encapsulation member and a front end of the lead is in the range of about 0.1 mm to about 3 mm, wherein the front end of the lead is located farthest from the electronic element in a direction substantially parallel to the first surface of the encapsulation member.

8. An electronic device comprising:
a circuit board having an upper surface and a lower surface facing each other; and
a semiconductor package mounted on the circuit board, the semiconductor package including:
a semiconductor substrate;
an encapsulation member that encapsulates the semiconductor substrate;
a lead electrically connected to the semiconductor substrate and extending outward from the encapsulation member; and
a package substrate on which the semiconductor substrate is mounted,
wherein the encapsulation member has a first surface and a second surface facing each other,
wherein a height of the encapsulation member is a distance between the first surface and the second surface,
wherein a central line of the encapsulation member is located equidistant from the first surface and the second surface,
wherein the lead is disposed entirely in a region between a plane of the first surface of the encapsulation member and a plane of the second surface of the encapsulation member, and
wherein the semiconductor package is mounted in an opening that is formed in the circuit board and passes through the circuit board and at least a portion of the semiconductor package passes through the circuit board.

9. The electronic device of claim 8, wherein a portion of the lead extends inward in the encapsulation member, and the lead in the encapsulation member is on a substantially same plane as the package substrate.

10. The electronic device of claim 8,
wherein the package substrate forms a portion of the first surface of the encapsulation member.

11. The electronic device of claim 8,
wherein a degree of deviation of a center of a front end of the lead from the central line of the encapsulation member is no greater than 30% of the height of the encapsulation member, wherein the front end of the lead is located farthest from the semiconductor substrate in a direction substantially parallel to the first surface of the encapsulation member.

12. The electronic device of claim 8,
wherein a distance measured in a direction parallel to the first surface of the encapsulation member between a point where the lead exits the encapsulation member and a front end of the lead is in the range of about 0.1 mm to about 3 mm, wherein the front end of the lead is located farthest from the semiconductor substrate in a direction substantially parallel to the first surface of the encapsulation member.

13. The electronic device of claim 8,
wherein a portion of one surface of the lead forms a portion of the first surface of the encapsulation member, and
the lead includes a distal portion that is bent toward the central line of the encapsulation member.

14. The electronic device of claim 8,
wherein the semiconductor substrate and the lead are connected to each other by a bonding wire.

15. The electronic device of claim 14,
wherein a portion of the semiconductor substrate forms a portion of the first surface of the encapsulation member.

16. The electronic device of claim 14,
wherein a portion of the lead outside the encapsulation member extends in a direction substantially parallel to the first surface of the encapsulation member.

17. The electronic device of claim 8,
wherein a portion of the lead overlaps with a portion of the semiconductor substrate and is attached to the semiconductor substrate via a binder disposed between the lead and the semiconductor substrate, and
wherein the lead is wire-bonded to a bonding pad disposed adjacent a central line of the semiconductor substrate.

18. An electronic system comprising:
a controller; an input/output unit configured to input or output data; a memory device configured to store data; an interface configured to transmit data to an external device; and a bus configured to allow the controller, the input/output unit, and the interface to communicate with one another, wherein at least one of the controller, the input/output unit, and the interface comprises
an electronic device comprising:
a substrate having an upper surface and a lower surface facing each other; and
an electronic component having a first surface and a second surface facing each other and mounted on the substrate, the electronic component including:
an electronic element;
an encapsulation member that encapsulates the electronic element and has a first surface and a second surface facing to each other,
wherein a height of the encapsulation member is a distance between the first surface and the second surface, and
wherein a central line of the encapsulation member is located equidistant from the first surface and the second surface; and
a lead electrically connected to the electronic element and extending outward from the encapsulation member,
wherein the lead is disposed entirely in a region between a plane of the first surface of the encapsulation member and a plane of the second surface of the encapsulation member, and
wherein the electronic component is mounted in an opening that is formed in the substrate and passes through the substrate and at least a portion of the electronic component passes through the substrate.

19. The electronic device of claim 8, wherein the first surface and the second surface of the encapsulation member protrude outward from the upper surface and the lower surface of the circuit board, respectively.

20. The electronic device of claim 8, wherein a distal portion of the lead, exposed outside of the encapsulation member, is bent toward the plane of the first or second surface of the encapsulation member to form a curved-shaped region.

* * * * *